United States Patent [19]

Kanazawa

[11] Patent Number: 5,053,980
[45] Date of Patent: Oct. 1, 1991

[54] METHOD AND APPARATUS FOR LOGIC SIMULATION

[75] Inventor: Kiyoshi Kanazawa, Katano, Japan

[73] Assignee: Matsushita Electric Industrial Co., Ltd., Osaka, Japan

[21] Appl. No.: 319,430

[22] Filed: Mar. 6, 1989

[30] Foreign Application Priority Data

Mar. 10, 1988 [JP] Japan ................................. 63-56616

[51] Int. Cl.[5] .............................................. G06F 15/60
[52] U.S. Cl. ..................................... 364/578; 364/488
[58] Field of Search ............... 364/526, 488, 490, 578, 364/300, 200, 900; 371/23, 17, 27; 340/705

[56] References Cited

U.S. PATENT DOCUMENTS 4,675,832 6/1987 Robinson et al. ................... 364/521
4,787,061 11/1988 Nei et al. ............................. 364/140
4,860,291 8/1989 Damm et al. ......................... 371/17

OTHER PUBLICATIONS

IEEE International Conference on Computer-Aided Design (ICCAD-87) 9-12 Nov. 1987, pp. 488-491, Santa Clara, CA, US; C. M. Dyson et al.: "A Pipelined Event-Driven Mixed-Mode Simulator".
IEEE Design and Test of Computers vol. 2, No. 5, Oct. 1985, pp. 61-73, NY, US; N. Koike et al.: "HAL: A High-Speed Logic Simulation Machine".

Primary Examiner—Parshotam S. Lall
Assistant Examiner—Ellis B. Ramirez
Attorney, Agent, or Firm—Stevens, Davis, Miller & Mosher

[57] ABSTRACT

Determination of an operation of a logic circuit is usually called logic simulation. The logic simulation in which changes in signal status at input terminals and output terminals of an element in the logic circuit to be simulated are represented by events and the signal status at the output terminal is calculated only for the element in which the event has occurred at the input terminal thereof, is called an event driven logic simulation. In the event driven logic simulation, a current time is used to decide and extract the event to be processed. In the prior art apparatus, the decision and extraction are interrupted when the current time is updated. In the present invention, identifiers (colors) are imparted to the events to group the events. The current time is updated when the event having a special color is not present. Thus, a simulation speed in the event driven logic simulation method and apparatus is improved.

8 Claims, 15 Drawing Sheets

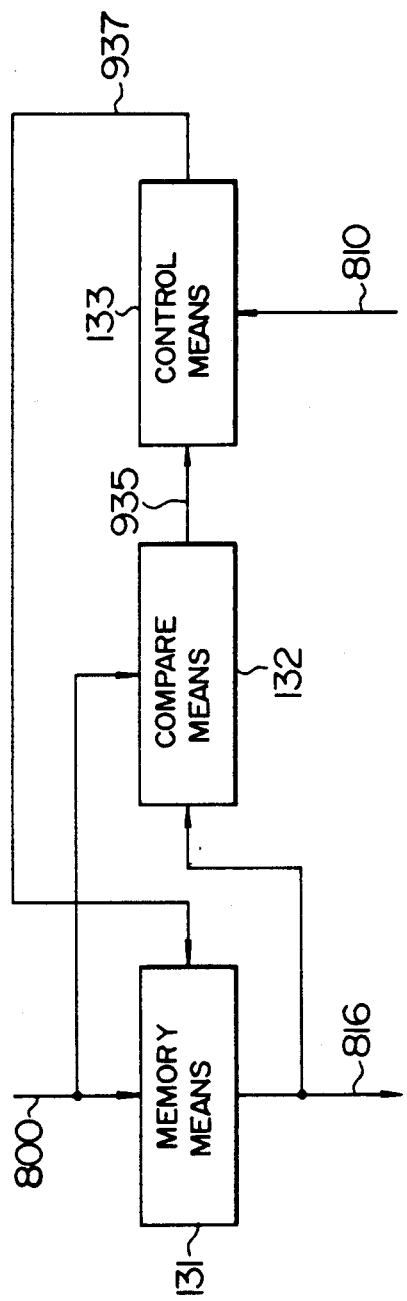
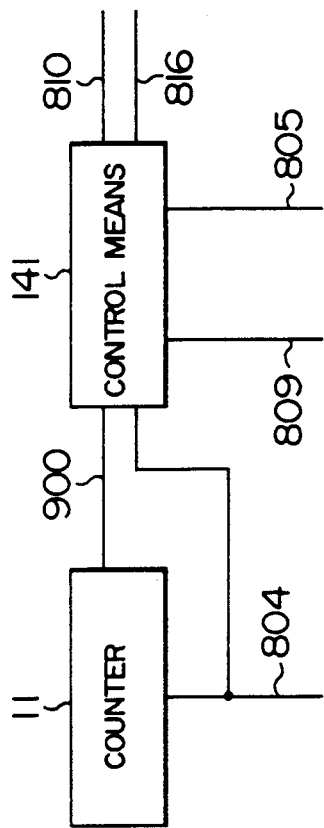

FIG. 18
a 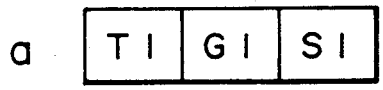
b 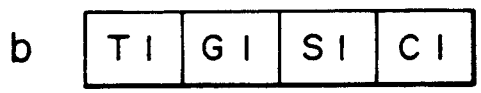
c 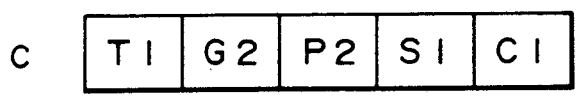
d 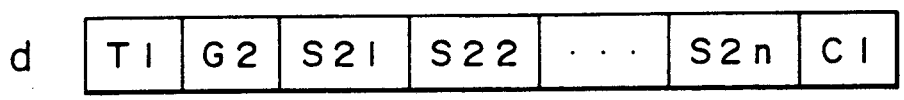
e 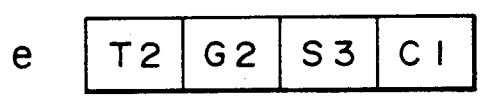
FIG. 19
f 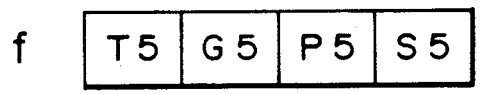
g 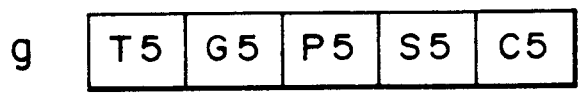
h 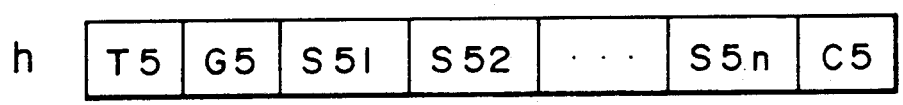
i 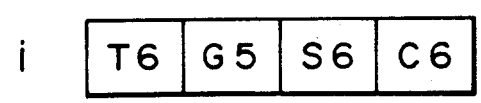
j 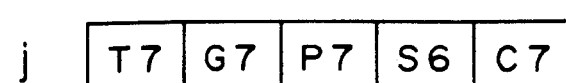

METHOD AND APPARATUS FOR LOGIC SIMULATION

BACKGROUND OF THE INVENTION

The present invention relates to method and apparatus for logic simulation to be used for verifying an operation of a logic circuit, and more particularly to method and apparatus for event driven logic simulation.

More specifically, the present invention relates to method and apparatus for logic simulation in which a change in a signal status at an input terminal or a change in a signal status at an output terminal of an element of a logic circuit to be simulated (a gate such as AND, NAND, OR, NOR or XOR, a memory such as RAM or ROM, a functional element such as flip-flop, counter or gate array, a bilateral element realized by MOS transistors, or a virtual element representing a bus) is considered as an event, and the signal status at the output terminal is calculated only for that element whose signal status at the input terminal has changed.

Prior art method and apparatus for logic simulation are explained with reference to FIG. 22 which shows a schematic configuration of a conventional event driven logic simulation apparatus. In FIG. 22, numeral 221 denotes a current time output unit, numeral 222 denotes an event memory, numeral 223 denotes an event take-out unit, numeral 224 denotes a circuit operation calculation unit, and numerals 826, 827, 828, 829, 830, 831 and 832 denote signal lines.

Simulation is carried out by transferring the event among the event memory 222, event take-up unit 23 and circuit operation calculation unit 224.

The current time output unit 221 is initially set to "0" and outputs a current time on the signal line 826.

The event memory 222 stores those events whose event times are equal to or larger than the current time.

The event take-out unit 223 takes out an event whose event time is equal to the current time from the event memory 222 through the signal line 827 and outputs it on the signal line 828.

The circuit operation calculation unit 224 receives the event from the signal line 828, calculates new changes in the signal status at the input terminal and the output terminal of the element in the logic circuit to be simulated, which changes are caused by a change in a signal status represented by the event, in accordance with the event driven algorithm, and outputs the event representing the result of calculation on the signal line 829.

The event memory 222 receives the event from the signal line 829 and stores it.

The current time output unit 221 is informed from the event memory 222 through the signal line 832 whether events whose event times are equal to the current time are present in the event memory 222, informed from the event take-out unit 223 through the signal line 830 whether an event is present in the event take-out unit 223, informed from the circuit operation calculation unit 224 through the signal line 831 whether an event is present in the circuit operation calculation unit 224, and when there is no event having the event time equal to the current time in the event memory 222 and there is no event in either the event take-out unit 223 or the circuit operation calculation unit 224, the current time output unit 221 determines that all processes for the current time have been completed and it advances the current time.

Then, the above processes are repeated for the new current time so that the simulation is proceeded.

Recently, such a logic simulation apparatus is realized by hardware and the event memory 222, event take-out unit 223 and circuit operation calculation unit 224 are pipelined or the circuit operation calculation unit 224 itself is further pipelined in order to attain a high speed in the simulation.

However, in the prior art logic simulation method, that is, the event driven logic simulation method in which the current time is advanced after all events in the event take-out unit and the circuit operation calculation unit have been processed, if a logic simulation apparatus for performing the simulation in accordance with the above simulation method is provided to effect pipeline processing by the event memory, event take-out unit and circuit operation calculation unit, it is necessary to store all events in the event memory. As a result, the increase of the processing speed by the pipeline processing is not substantial.

The high speed operation by the pipeline processing is explained in general with reference to FIGS. 20 and 21 which illustrate the pipeline processing. In FIG. 20, A, B and C denote processors which constitute a pipeline, and $n-2$, $n-1$, n, $n+1$ and $n+2$ denote data. In FIG. 21, A, B and C denote processors which constitute the pipeline, and $n-2$, $n-1$, $n+1$ and $n+2$ denote data.

It is assumed that the pipeline comprises three processors A, B and C which perform a series of processings. Each of the processors A, B and C can process one data in a unit time. If the processors A, B and C are not pipelined and the data are serially processed, three units of processing time are required for each data. By the pipeline processing, the processing speed may be increased. As shown in FIG. 20, it is assumed that at a time t, the data n is processed by the processor A, the data $n-1$ is processed by the processor B and the data $n-2$ is processed by the processor C. At a time $t+1$, the new data $n+1$ is processed by the processor A, the data n is processed by the processor B and the data $n-1$ is processed by the processor C. At a time $t+2$, the new data $n+2$ is processed by the processor A, the data $n+1$ is processed by the processor B and the data n is processed by the processor C.

Thus, in the pipeline processing, the three data $n-2$, $n-1$ and n are outputted from the pipeline in the three units of times t, $t+1$ and $t+2$. Thus, one data is processed in one unit time as a whole, and the processing speed is three times as high as that of the serial processing.

However, if the data are not continuously supplied from the external and there is no data to be processed in one of the processors in the pipeline, the degree of high speed operation of the pipeline processing decreases. As shown in FIG. 21, it is assumed that at a time t, the data $n-1$ is processed by the processor B and the data $n-2$ is processed by the processor C, but there is no data to be processed in the processor A. At the time $t+1$, the new data $n+1$ is processed by the processor A and the data $n-1$ is processed by the processor C, but there is no data to be processed in the processor B. At the time $t+2$, the new data $n+2$ is processed by the processor A and the data $n+1$ is processed by the processor B, but there is no data to be processed in the processor C. Thus, the two data $n-2$ and $n-1$ are outputted in the three units of times t, t+1 and t+2, and as a whole, one data is processed in 1.5 unit time.

Thus, if there is no data to be processed in one of the processors in the pipeline (a gap in the pipeline) or there is no data to be processed in the pipeline (vacancy in the pipeline), the degree of high speed operation by the pipeline processing is lowered.

Accordingly, in order to fully accomplish the high speed operation by the pipeline processing, it is necessary to continuously supply the data to the pipeline.

However, in the prior art event driven logic simulation method in which the current time is advanced after all events in the event take-out unit and the circuit operation calculation unit have been processed, the update of the current time by the current time output unit and the take-out of the event having the new event time by the event take-out unit must be carried out after the event take-out unit has taken out all events having the equal event time to the current time from the event memory and the circuit operation calculation unit has processed all such events. Thus, the two processors, that is, the vent take-out unit and the circuit operation calculation unit of the pipeline which comprises the event memory, event take-out unit and circuit operation calculation unit must be emptied.

As a result, where the prior art method in which the current time is advanced after the events in the event take-out unit and the circuit operation calculation unit have been emptied is used, the degree of high speed operation by the pipeline processing is lowered even if the logic simulation apparatus for the pipeline processing is prepared.

SUMMARY OF THE INVENTION

It is an object of the present invention to provide a logic simulation apparatus which has a smaller gap in a pipeline than that of the logic simulation apparatus designed by the prior art method in which the current time is advanced after the event take-out unit and the circuit operation calculation unit have been emptied.

In order to achieve the above object, the present invention comprises a coloring unit for applying a color identifier (hereinafter simply referred to as color) to an event by selecting the color from a plurality of colors, a special color designation unit for selecting one special color from the plurality of colors which the coloring unit may apply to the event, and a special color detection unit for detecting whether an event having the special color is present in an event take-out unit or a circuit operation calculation unit. It further comprises a color change unit, a minimum time memory and a second event take-out unit.

The coloring unit selects colors from the plurality of colors and apply the selected colors to the events to color the events in the event take-out unit and the circuit operation calculation unit. The special color designation unit designates one special color from the plurality of colors which the coloring unit may apply to the events. The special color detection unit detects whether the event having the special color is present in the event take-out unit or the circuit operation calculation unit. The current time output unit advances the current time not depending on whether there is no event in the event take-out unit and the circuit operation calculation unit but depending on whether the event having the special color is present in the event take-out unit or the circuit operation calculation unit in accordance with the output of the special color detection unit. Thus, the current time output unit can advance the current time without waiting until the events in the event take-out unit and the circuit operation calculation unit are exhausted, and the event take-out unit may thereafter start to take out the event having the new event time. Thus, the gap in the pipeline may be narrowed.

The color change unit is provided in the circuit operation calculation unit so that it changes the color of the event in the circuit operation calculation unit to the special color if the event time of that event is equal to the current time and changes the color of the event in the circuit operation calculation unit to a different color from the special color when the event time of that event is changed to a different time from the current time. Thus, even if a logic circuit including an element having zero propagation delay time is a subject of simulation, the current time may be advanced by using the colors without waiting until the events in the event take-out unit and the circuit operation calculation unit are exhausted.

The minimum time memory is further provided so that the current time output unit may further advance the current time to the content stored in the minimum time memory if there is no event in the event memory which has the equal event time to the current time.

In addition to the first event take-out unit for taking out the event having the equal event time to the current time from the event memory, a second event take-out unit is provided for taking out an event having a smallest event time from the events which represent changes in signal status at all input terminals of the elements thereof where the change in the signal status at the input terminal of the element is handled independently from element to element. Further, the coloring unit, special color designation unit and minimum time memory are provided. When the current time is to be updated by the current time output unit by using the color, the second event take-out unit may take out the event from the event memory even if the first event take-out unit cannot take out the event from the event memory. Thus, the gap in the pipeline can be further reduced.

BRIEF DESCRIPTION OF THE DRAWINGS

FIG. 13 shows a configuration of an embodiment of a minimum time memory, FIG. 14 shows a configuration of a second embodiment of the current time output unit, FIGS. 18 and 19 show structures of events.

DESCRIPTION OF THE PREFERRED EMBODIMENTS

Figure 1:
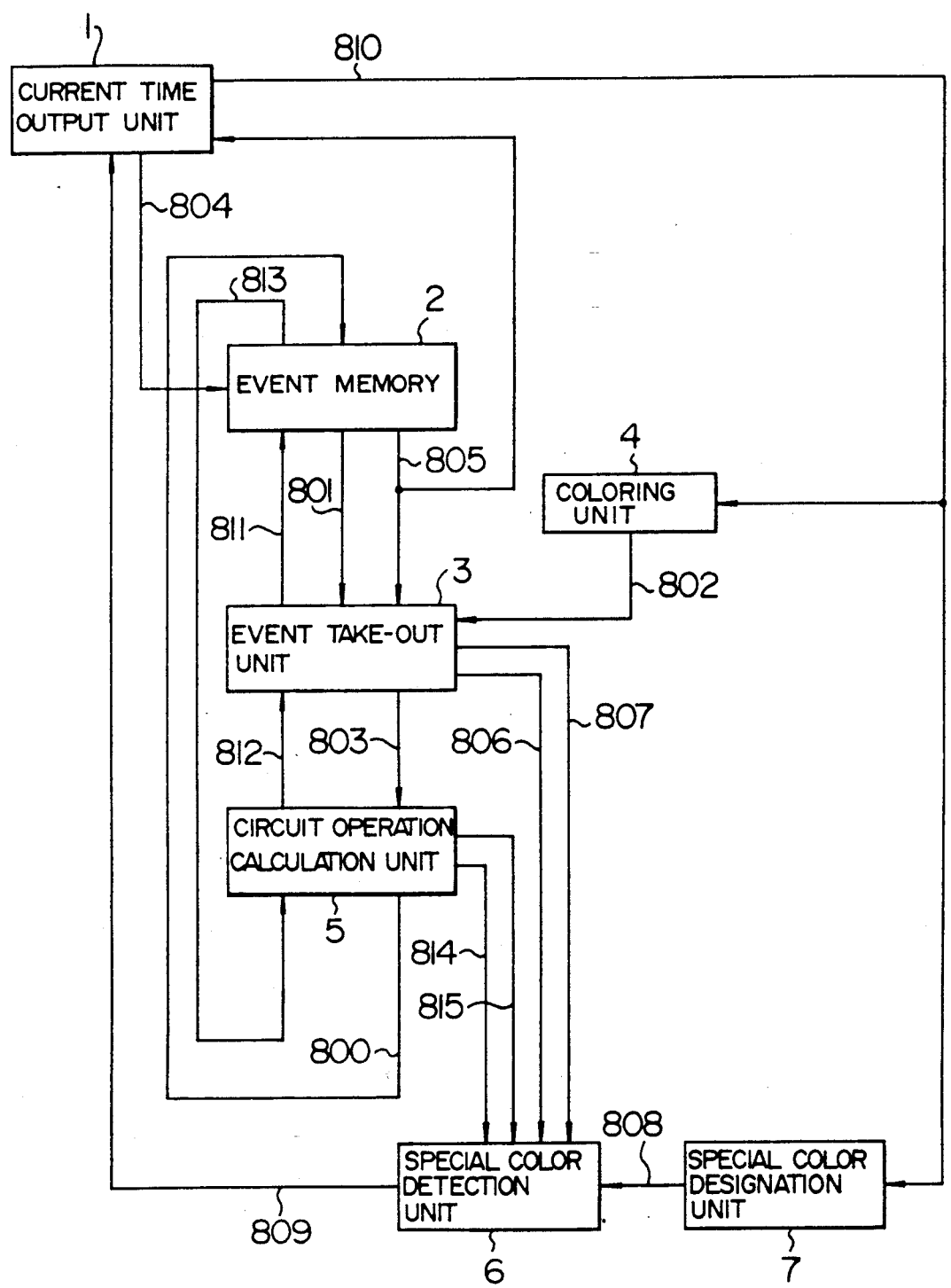
FIG. 1 shows a configuration of a first embodiment of a logic simulation apparatus of the present invention.

FIG. 1 shows a configuration of a first embodiment of the logic simulation apparatus of the present invention. Numeral 1 denotes a current time output unit, numeral 2 denotes an event memory, numeral 3 denotes an event take-out unit, numeral 4 denotes a coloring unit, numeral 5 denotes a circuit operation calculation unit, numeral 6 denotes a special color detection unit, numeral 7 denotes a special color designation unit, and numerals 800, 801, 802, 803, 804, 805, 806, 807, 808, 809, 810, 811, 812, 813, 814 and 815 denote signal lines.

FIG. 18 shows a first example of data to be processed by the logic simulation apparatus of the present invention, that is, the data of the event. In FIG. 18, a, b, c, d and e denote events, T1 and T2 denote event times, G1 and G2 denote element numbers, S1, S21, S22, S2n, S3 denote signal status, Cl denotes color, and P2 denotes an input terminal number of the element.

The coloring unit 4 may apply two colors, blue and green to the event, and an initial value is blue. The value is outputted on the signal line 802.

The special color designation unit 7 outputs the special color on the signal line 808. The special color is one of blue and green, and an initial value thereof is green.

The current time output unit 1 outputs the current time on the signal line 804. An initial value thereof is "0". It is assumed that the current time is T1.

The event memory 2 stores the events which represent changes in signal status at the output terminals of the elements, which changes are externally applied to the logic circuit to be simulated. The event memory 2 further reads the current time from the signal line 804, and outputs a true value on the signal line 805 when an event which has the equal event time to the current time is present therein, and outputs a false value on the signal line 805 when no event which has the equal event time to the current time is present therein.

The event take-out unit 3 reads the value on the signal line 805, and if it is the true value, it outputs a read event command on the signal line 811. When the value on the signal line 805 is the false value, the event take-out unit 3 does not output the read event command on the signal line 811.

When the event memory 2 receives the read event command from the signal line 811, it takes out one event a from the events having the equal event time to the current time T1 read from the signal line 804 and sends it to the event take-out unit 3 through the signal line 801. An element number of the event a is represented by G1 and a signal status thereof is represented by S1. After the event memory 2 has outputted the event a, it erases the event a from the event memory 2. If the read event command is not outputted on the signal line 811, the event memory 2 does not take out the event a.

The coloring unit 4 applies, through the signal line 802, a color C1 to the event a received by the event take-out unit 3 from the signal line 801.

The event take-out unit 3 outputs an event b which is the event a having colored with the color C1, on the signal line 803. When a blue event is present in the event take-out unit 3, that is, when the color Cl of the event b is blue, the event take-out unit 3 outputs a true value on the signal line 806. When there is no blue event in the event take-out unit 3, that is, when the color Cl of the event b is not blue, the event take-out unit 3 outputs a false value on the signal line 806. When there is a green event in the event take-out unit 3, that is, when the color Cl of the event b is green, the event take-out unit 3 outputs the true value on the signal line 807. When there is no green event in the event take-out unit 3, that is, when the color Cl of the event b is not green, the event take-out unit 3 outputs the false value on the signal line 807.

When the circuit operation calculation unit 5 receives the event b from the signal line 803, it outputs on the signal line 812 a signal representing the receipt of the event b. When the event take-out unit 3 receives this signal through the signal line 812, it starts to take out the next event from the event memory 2.

Based on the event driven algorithm, the circuit operation calculation unit 5 calculates changes in signal status at input terminals and output terminals of elements in a logic circuit, which changes is caused by changes in signal status of the logic circuit to be simulated, represented by the event b received from the signal line 803, and outputs on the signal line 800 an event e which represents changes in the signal status at the output terminal of the element. The circuit operation calculation unit 5 handles only the logic circuit having an element propagation delay time of no less than one. Accordingly, the event time T2 of the event e is larger than the event time T1 of the event b. The color C1 of the event e which is outputted by the circuit operation calculation unit 5 on the signal line 800 is same as the color C1 of the event b received from the signal line 803, which is the cause of the event e. The process in which the circuit operation calculation unit 5 receives the event b and outputs the event e will be explained in detail in connection with a first embodiment of the circuit operation calculation unit. The circuit operation calculation unit 5 may have a plurality of events therein and process those events parallelly.

When there is a blue event in the circuit operation calculation unit 5, the unit 5 output a true value on the signal line 814, and when there is no blue event, it outputs a false value on the signal line 814. When there is a green event in the circuit operation calculation unit 5, the unit outputs a true value on the signal line 815, and when there is no green event, it outputs a false value on the signal line 815.

The event memory 2 receives the event e from the signal line 800, and stores the event e excluding the color Cl. When the event memory 2 has stored the event e, it outputs on the signal line 813 a signal representing the termination of storing of the event e.

The circuit operation calculation unit 5 holds the event e therein until it receives the above signal from the event memory 2 through the signal line 813. After it has received the signal, it erases the event e from the unit 5.

The special color detection unit 5 detects the presence of the event having the special color in at least one of the event take-out unit 3 and the circuit operation calculation unit 5 based on the values outputted by the event take-out unit 3 on the signal lines 806 and 807, the values outputted by the circuit operation calculation unit 5 on the signal lines 814 and 815 and the special color outputted by the special color designation unit 7 on the signal line 808. If such an event is present in at least one of the event take-out unit 3 and the circuit operation calculation unit 5, the special color detection unit 6 outputs a true value on the signal line 809, and if such an event is not present in either the event take-out circuit 3 or the circuit operation calculation unit 5, it outputs a false value on the signal line 809.

When both of the values on the signal lines 805 and 809 are false, the current time output unit 1 advances the current time by one and outputs a change color command on the signal line 810. When one of the values on the signal lines 805 and 809 is true, the current time output unit 1 does not update the current time nor does it output the change color command.

For example, where the current time is an initial value "0", the events in the event take-out unit 3 and the circuit operation calculation unit 5 are blue and the special color is green. Thus, the value on the signal line 809 is false. Accordingly, when the event take-out unit 3 has taken out all events whose event times are "0" from the event memory 2 and the value on the signal line 805 changes to the false value, that is, while the blue event is still present in the event take-out unit 3 or the circuit operation calculation unit 5, the current time output unit 1 updates the current time and outputs the change color command.

When the coloring unit 4 receives the change color command from the signal line 810, it change the color to be outputted on the signal line 802 from blue to green, or from green to blue.

When the special color designation unit 7 receives the change color command from the signal line 810, it changes the special color to be outputted on the signal line 808 from green to blue or from blue to green.

On the other hand, after the current time on the signal line 804 has been advanced by one, the event take-out unit 3 may start to take out the event having the equal event time to the current time from the event memory 2.

In accordance with the present invention, the event take-out unit 3 can start to take out the event having the next event time without waiting until the events in the event take-out unit 3 and the circuit operation calculation unit 5 of the pipeline which comprises the event memory 2, event take-out unit 3 and the circuit operation calculation unit 5 are exhausted. Accordingly, the simulation may be performed without emptying the event take-out unit 3 and the circuit operation calculation unit 5 of the pipeline so that the reduction of the simulation speed due to the gap in the pipeline is prevented.

Figure 2:
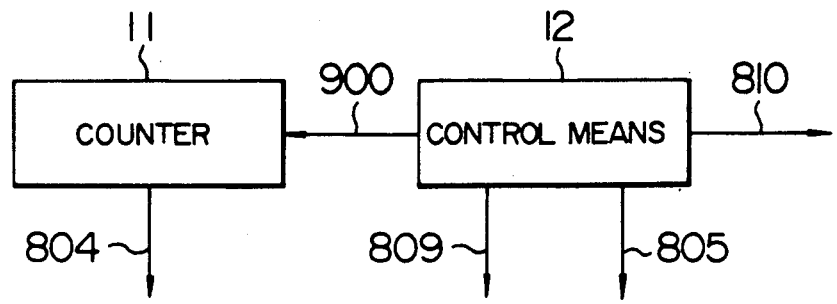
FIG. 2 shows a configuration of a first embodiment of a current time output unit.

FIG. 2 shows a configuration of a first embodiment of the current time output unit of the present invention. In FIG. 2, numeral 11 denotes a counter, numeral 12 de-notes control means, and numerals 900, 804, 805, 809 and 810 denote signal lines.

The counter 11 always outputs the current time on the signal line 804.

Prior to the start of simulation, the control means 12 outputs an initialize current time command on the signal line 900. When the counter 11 receives the initialize current time command from the signal line 900, it sets the current time to "0". During the simulation operation, the control means 12 reads the values on the signal lines 809 and 805, and when both values on the signal lines 809 and 805 are false, it outputs the update current time command on the signal line, and the change color command on the signal line 810. If at least one of the values on the signal lines 809 and 805 is true, the control means 12 does not output the update current time command or the change color command.

When the counter 11 receives the update current time command from the signal line 900, the counter 11 advances the current time by one.

Figure 3:
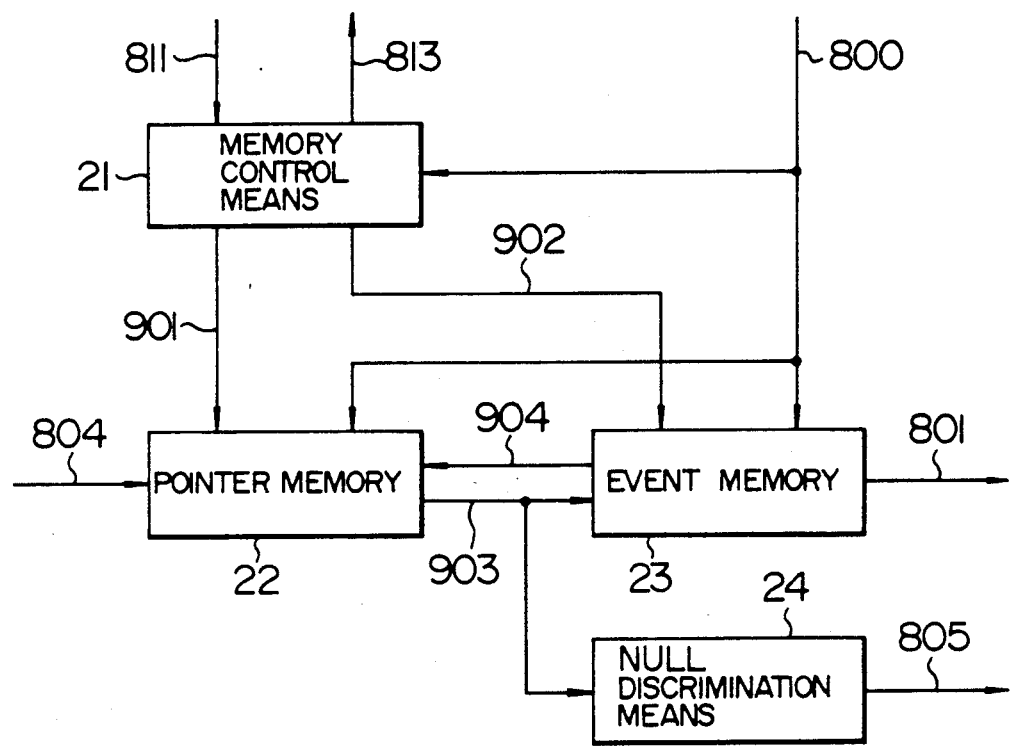
FIG. 3 shows a configuration of a first embodiment of an event memory.

FIG. 3 shows a configuration of a first embodiment of the event memory of the present invention. In FIG. 3, numeral 21 denotes memory control means, numeral 22 denotes a pointer memory, numeral 23 denotes an event memory, numeral 24 denotes null discrimination means, and numerals 901, 902, 903, 904, 800, 801, 804, 805, 811 and 813 denote signal lines.

The event memory 23 stores the events received from the signal line 800, excluding the colors.

The pointer memory 22 uses a time as a key and stores an address of the event memory 23 at which the event having the equal event time to the key time is stored.

The pointer memory 22 reads the current time from the signal line 804, uses the current time as a key, and outputs on the signal line 903 an address of the event memory 23 at which one of the events having the equal event time to the current time is stored. If there is no event having the equal event time to the current time in the event memory 23, the pointer memory 22 output a special value NULL on the signal line 903 to represent it.

When the value on the signal line 903 is NULL, the NULL discrimination means 24 outputs a false value on the signal line 805, and when the value on the signal line 903 is not NULL, it outputs a true value.

When the memory control means 21 receives a read event command from the signal line 811, it controls the event memory 23 through the signal line 902 to cause the event memory 23 to output on the signal line 801 the event stored at the address designated by the value on the signal line 903 and erase the event stored at that address. The memory control means 21 further controls the pointer memory 22 through the signal line 901 and informs to the pointer memory 22 that the event has been erased from the address of the event memory 23 outputted on the signal line 903, and causes the pointer memory 22 to output on the signal line 903 the address of the event memory 23 at which one of the events having the equal event time to the current time and which remains in the event memory 23 after the above event has been erased. If there is no event having the equal event time to the current time in the event memory 23 after the erasure of the above event, the memory control means 21 causes the pointer memory 22 to output NULL on the signal line 903.

When the event is sent on the signal line 800, the memory control means 21 controls the event memory 23 through the signal line 902 to cause the even memory 23 to store the event sent through the signal line 800 excluding the color and output the stored address on the signal line 904. The memory control means 21 further controls the pointer memory 22 through the signal line 901 and causes the pointer memory 22 to store the fact that the event sent through the signal line 800 has been stored at the address of the event memory 23 designated by the value on the signal line 904.

After the memory control means 21 has completed the storing of the event in the event memory 23 and the storing of the address in the pointer memory 22, it outputs on the signal line 813 a signal indicating the completion of the storing of the event.

Figure 4:
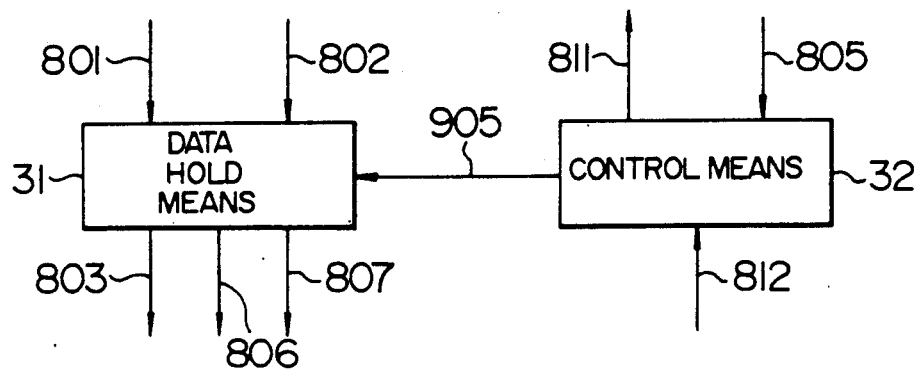
FIG. 4 shows a configuration of an embodiment of an event take-out unit.

FIG. 4 shows a configuration of an embodiment of the event take-out unit of the present invention. In FIG. 4, numeral 31 denotes data hold means, numeral 32 denotes control means, and numerals 905, 801, 802, 803, 805, 806, 807, 811 and 812 denote signal lines.

The process by the event take-out unit is explained for a case where the event a of FIG. 18 is received from the signal line 801.

When there is no event in the data hold means 31 and the value on the signal line 805 is true, the control means 32 outputs the read event command on the signal line 811 and outputs a write data command on the signal line 905.

When the data hold mean s31 receives the write data command from the signal line 905, it reads the colorless event a from the signal line 801 and the color C1 from the signal line 802 and outputs the colored event b on the signal line 803. When the color c1 of the event b held in the data hold means 31 is blue, the data hold means 31 outputs a true value on the signal line 806 and outputs a false value on the signal line 807. When the color C1 of the event b1 held in the data hold means 31 is green, the data hold means 31 outputs the false value on the signal line 806 and outputs the true value on the signal line 807. If there is no event in the data hold means 31, it outputs the false value on both the signal lines 806 and 807.

When the control means 32 receives from the signal line 812 the signal indicating that the circuit operation calculation unit has received the event b, it determines that the event in the data hold means 31 has been processed and it starts to take out a new event.

Figure 5:
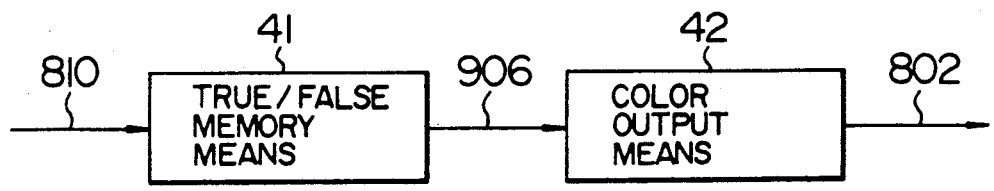
FIG. 5 shows a configuration of an embodiment of a coloring unit.

FIG. 5 shows a configuration of an embodiment of the coloring unit of the present invention. In FIG. 5, numeral 41 denotes true/false memory means, numeral 42 denotes color output means, and numerals 906, 810 and 802 denote signal lines.

The true/false memory means 41 stores one of the two values, true value and false value and outputs the selected value on the signal line 906. The initial value stored in the true/false memory means 41 is true. When the true/false memory means 41 receives the change color instruction from the signal line 810, it changes the stored value which is outputted on the signal line 906 from true to false or from false to true.

The color output means 42 reads the value on the signal line 906 and outputs blue on the signal line 802 if the value on the signal line 906 is true, and outputs green if the value is false.

Figure 6:
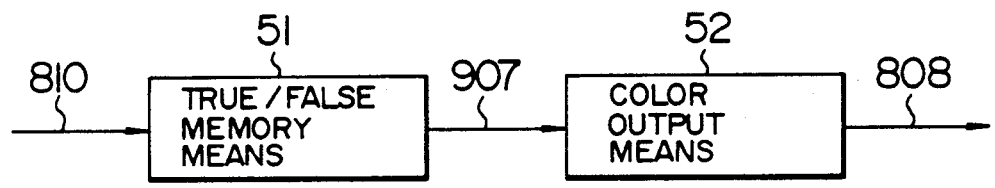
FIG. 6 shows a configuration of an embodiment of a special color designation unit.

FIG. 6 shows a configuration of an embodiment of the special color designation unit of the present invention. In FIG. 6, numeral 51 denotes true/false memory means, numeral 52 denotes color output means, and numerals 907, 810 and 808 denote signal lines.

The true/false memory means 51 selects and stores one of the two values, true values and false value, and outputs the selected value on the signal line 907. The initial value stored in the true/false memory means 51 is false. When the true/false memory means 51 receives the change color command from the signal line 810, it changes the stored value which is outputted on the signal line 907 from true to false or from false to true.

The color output means 52 reads the value on the signal line 907, and outputs blue on the signal line 808 when the value is true, and outputs green when the value is false.

Figure 7:
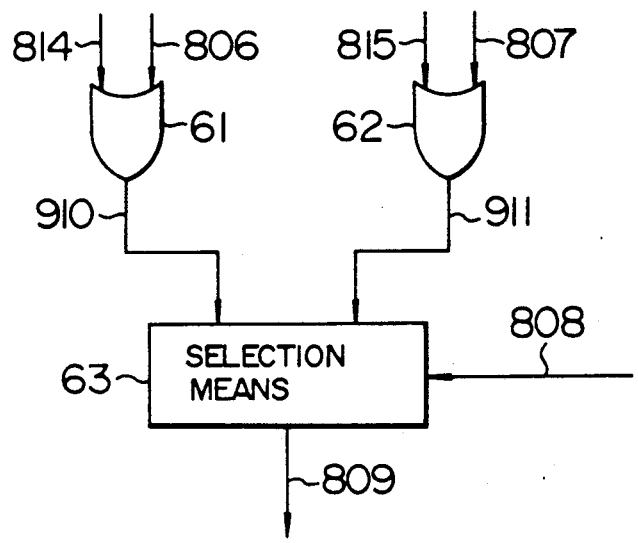
FIG. 7 shows a configuration of an embodiment of a special color detection unit.

FIG. 7 shows a configuration of an embodiment of the special color detection unit of the present invention. In FIG. 7, numerals 61 and 62 denote OR gates, numeral 63 denotes selection means, and numerals 910, 911, 806, 807, 808, 809, 814 and 815 denote signal lines.

The OR gate 61 reads the values on the signal lines 814 and 806, and if at least one of those values is true, it outputs a true value on the signal line 910, and if both values are false, it outputs a false value on the signal line 910.

The OR gate 62 reads the values on the signal lines 815 and 807, and if at least one of those values is true, it outputs a true value on the signal line 911, and if both values are false, it outputs a false value on the signal line 911.

The selection means 63 reads the value on the signal line 808, and if the value is blue, it outputs the value of the signal line 910 on the signal line 809, and if the value on the signal line 808 is green, it outputs the value of the signal line 911 on the signal line 809.

Figure 8:
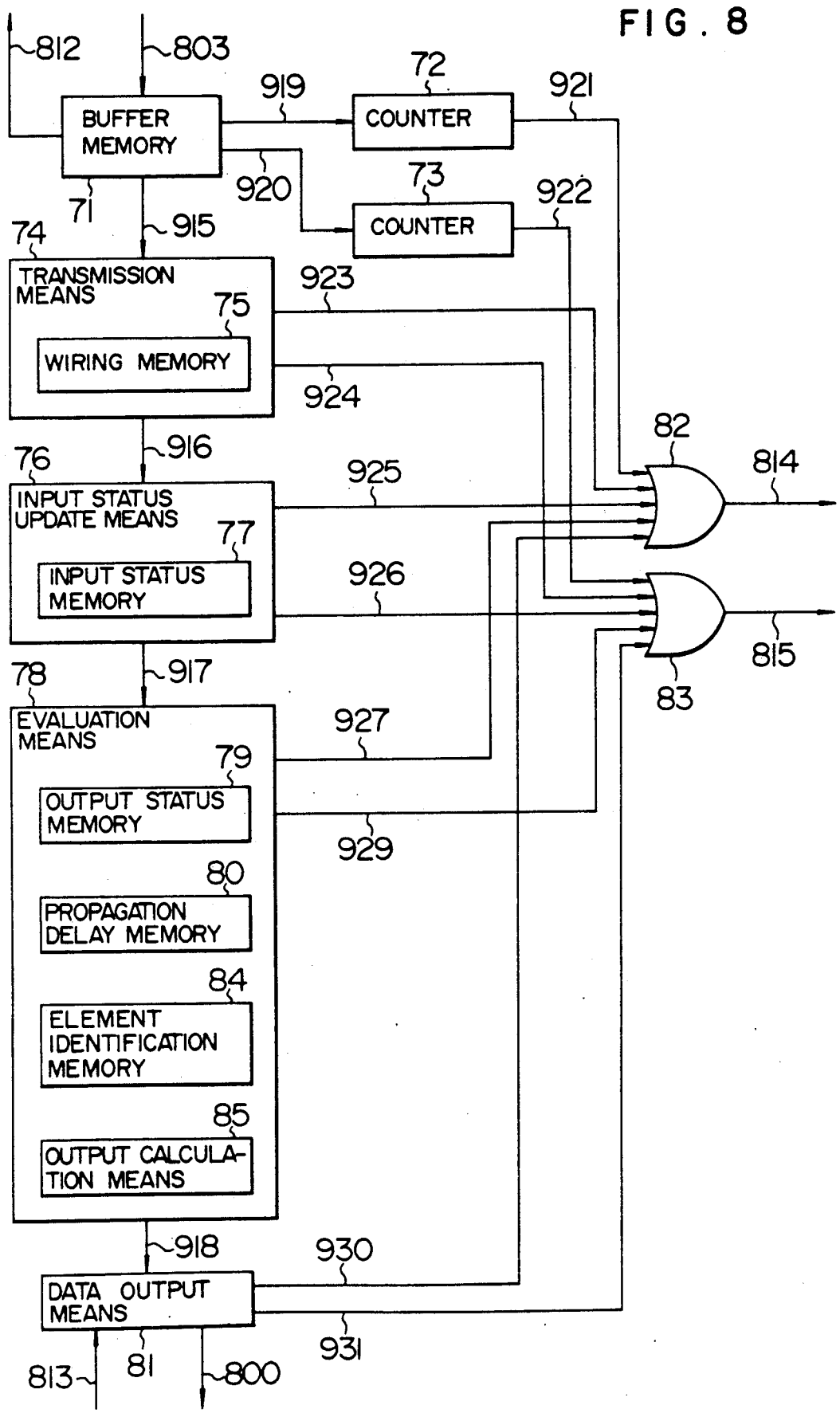
FIG. 8 shows a configuration of a first embodiment of a circuit operation calculation unit.

FIG. 8 shows a configuration of a first embodiment of the circuit operation calculation unit of the present invention. In FIG. 8, numeral 71 denotes a buffer memory, numerals 72 and 73 denote counters, numeral 74 denotes transmission means, numeral 75 denotes a wiring memory, numeral 76 denotes input status update means, numeral 77 denotes an input status memory, numeral 78 denotes evaluation means, numeral 79 denotes an output status memory, numeral 80 denotes a propagation delay memory, numeral 81 denotes data output means, numerals 82 and 83 denote OR gates, numeral 84 denotes an element identification memory, numeral 85 denotes output calculation means, and numerals 915, 916, 917, 918, 919, 920, 921, 922, 923, 924, 925, 926, 927, 929, 930, 931, 800, 803, 812, 813, 814 and 815 denote signal lines.

The process by the circuit operation calculation unit is explained for a case where the circuit operation calculation unit receives the event b of FIG. 18.

The buffer memory 71 receives the event b from the signal line 803 and temporarily stores the event b. After the buffer memory 71 has stored it, it outputs on the signal line 812 a signal indicating the receipt of the event b. Before the buffer memory 71 outputs the signal indicating the receipt of the event b on the signal line 812, it outputs an add command on the signal line 919 if the color C1 of the event b is blue, and outputs the add command on the signal line 920 if the color C1 is green.

The buffer memory 71 can store a plurality of events therein and outputs those events on the signal line 915 in the order of receipt. If the color of the outputted event is blue, the buffer memory 71 outputs a subtract command on the signal line 919, and if the color of the outputted event is green, it outputs the subtract command on the signal line 920.

The counter 72 counts the number of blue events which are present in the buffer memory 71. The initial value of the count is "0". When the counter 72 receives the add command from the signal line 919, it increments the count by one, and when it receives the subtract command from the signal line 919, it decrements the count by one. When the count is "0", the counter 72 outputs a false value on the signal line 921, and when the count is other than "0", it outputs a true value on the signal line 921.

The counter 73 counts the number of green events which are present in the buffer memory 71. The initial value of the count is "0". When the counter 73 receives the add command from the signal line 920, it increments the count by one, and when it receives the subtract command from the signal line 920, it decrements the count by one. When the count is "0", the counter 73 outputs a false value on the signal line 922, and when the count is other than "0", it outputs a true value on the signal line 922.

The transmission means 74 includes the wiring memory 75 which stores connectivity (wiring of a logic circuit) of elements in the logic circuit to be simulated. When the transmission means 74 receives from the signal line 915 the event b which represents changes in signal status at the output terminals of the elements in the logic circuit to be simulated, it reads the wiring memory 75 by using the element number G1 of the event b as an address, reads the element number G2 of the succeeding element to the element G1 and the input terminal number P2 of the element G2, prepares an event c which represents a change in signal status at the input terminal P2 of the succeeding stage element G2 and outputs it on the signal line 916. The event time, signal status and color of the event c are identical to the event time T1, signal status S1 and color Cl of the event b. Where there are a plurality of elements connected succeeding to the element G1, the events which represent the changes in signal status at the input terminals of all elements connected succeeding to the element G1 are sequentially prepared and they are outputted on the signal line 916. Thereafter, the transmission means 74 erases the event b.

The transmission means 74 outputs a true value on the signal line 932 if the blue event is present in the transmission means 74, outputs a false value on the signal line 923 if the blue event is not present, outputs a false value on the signal line 924 if the green event is present in the transmission means 74, and outputs a false value on the signal line 924 if the green event is not present.

The input status update means 76 has the input status memory 77 for storing signal status at all input terminals of all elements in the logic circuit to be simulated. When the input status update means 76 receives the event c through the signal line 916, it writes the signal status S1 of the event c as a new signal status at the input terminal P2 of the element G2 into the input status memory 77 by using the element number G2 of the event c and the input terminal number P2 as an address.

Thereafter, the input status update means 76 reads the signal status S21, S22, - - - S2n at all input terminals of the element G2 from the input status memory 77 by using the input terminal numbers and the element number G2 as the addresses while it sequentially changes the input terminal number. The input status update means 76 further prepares an event d having the event time T1 of the event c, element number G2, color Cl and signal status S21, S22, - - - S2n as the values thereof, and outputs it on the signal line 917. Then, the input status update means 76 erases the event c.

The input status update means 76 outputs a true value on the signal line 925 when there is a blue event in the input status update means 76, outputs a false value on the signal line 925 when there is not blue event, outputs a true value on the signal line 926 when there is a green event, and outputs a false value on the signal line 926 when there is no green event.

The evaluation means 78 comprises the element identification memory 84 for outputting a type of element (a function of element such as 2-input AND gate, 4-input OR gate or JK flip-flop) by using the element number as an address, the output calculation means 85 for receiving the signal status at all input terminals of the element and the type of element to calculate the signal status at the output terminal of the element, the propagation delay memory 80 for storing a propagation delay time of the element required between a change in the signal status at the input terminal of the element and a change in the signal status at the output terminal of the same element, and the output status memory 79 for storing the signal status at the output terminal of the element.

When the evaluation means 78 receives the event d from the signal line 917, it reads the type of the element G2 from the element identification memory 84 by using the element number G4 of the event d as an address, and supplies the type of the element G2 and the signal status S21, S22, - - - S2n of the event d to the output calculation means 85 which calculates a new signal status S3 at the output terminal of the element G2. The evaluation means 78 reads the precalculated signal status at the output terminal of the element G2 from the output status memory 79 by using the element number G2 of the event d as an address, and compares it with the new signal status S3 at the output terminal of the element G2 calculated by the output calculation means 85.

When those signal status are not equal, the evaluation means 78 writes the new signal status S3 at the output terminal of the element G3 into the output status memory 79, and prepares an event e which represents the change in the signal status at the output terminal of the element G2 and outputs it on the signal line 918. The signal status of the event e is the signal status S3 calculated by the output calculation means 85. The element number and the color of the event e are the element G2 and the color Cl of the event d. The event time T2 of the event e is a sum of the propagation delay time of the element G2 read from the propagation delay memory 0 and the event time T1 of the event d. The evaluation means 78 then erases the event d.

When the signal status at the output terminal of the element G2 read from the output status memory 79 and the new signal status S3 at the output terminal of the element G2 calculated by the output calculation means 85 are equal, the evaluation means 78 does not prepares the event e nor outputs the event e on the signal line 918 but erases the event d.

The evaluation means 78 outputs a true value on the signal line 927 when there is a blue event in the evaluation means 78, outputs a false value on the signal line 927 when there is no blue event, outputs a true value on the signal line 929 when there is a green event, and outputs a false value when there is no green event.

When the data output means 81 receives the event e from the signal line 918, it temporarily stores the event e and outputs it on the signal line 800. The data output means 81 holds the event e until it receives from the signal line 813 a signal indicating that the event memory has stored the event e and when it receives that signal, it erases the event e and receives a new event from the signal line 918.

The data output means 81 outputs a time value on the signal line 930 when there is a blue event in the data output means 81, outputs a false value on the signal line 930 when there is no blue event, outputs a true value on the signal line 931 when there is a green event, and outputs a false value on the signal line 931 when there is no green event.

The OR gate 82 always reads the values on the signal lines 921, 923, 925, 927 and 930, and outputs a true value on the signal line 814 if at least one of those values is true, and outputs a false value on the signal line 814 if all of those values are false.

The OR gate 83 always reads the values on the signal lines 922, 924, 926, 929 and 931, and outputs a true value on the signal line 815 if at least one of those signals is true, and outputs a false value on the signal line 815 if all of those values are false.

In the above description, the processes by the respective units from the reception of the event b by the buffer memory 71 to the output of the event e by the data output means 81 are serially carried out, although the buffer memory 71, transmission means 74, input status update means 76, evaluation means 78 and data output means 81 may be pipelined so that a plurality of events may be parallelly processed.

In the present embodiment, the transmission means, input state update means and evaluation means are single respectively. Alternatively, any of the transmission means, input status update means and evaluation means may be provided in parallel to attain parallel processing.

Alternatively, the buffer memory and the counter may be provided between the transmission means and the input status update means, between the input status update means and the evaluation means, or between the evaluation means and the data output means.

Figure 9:
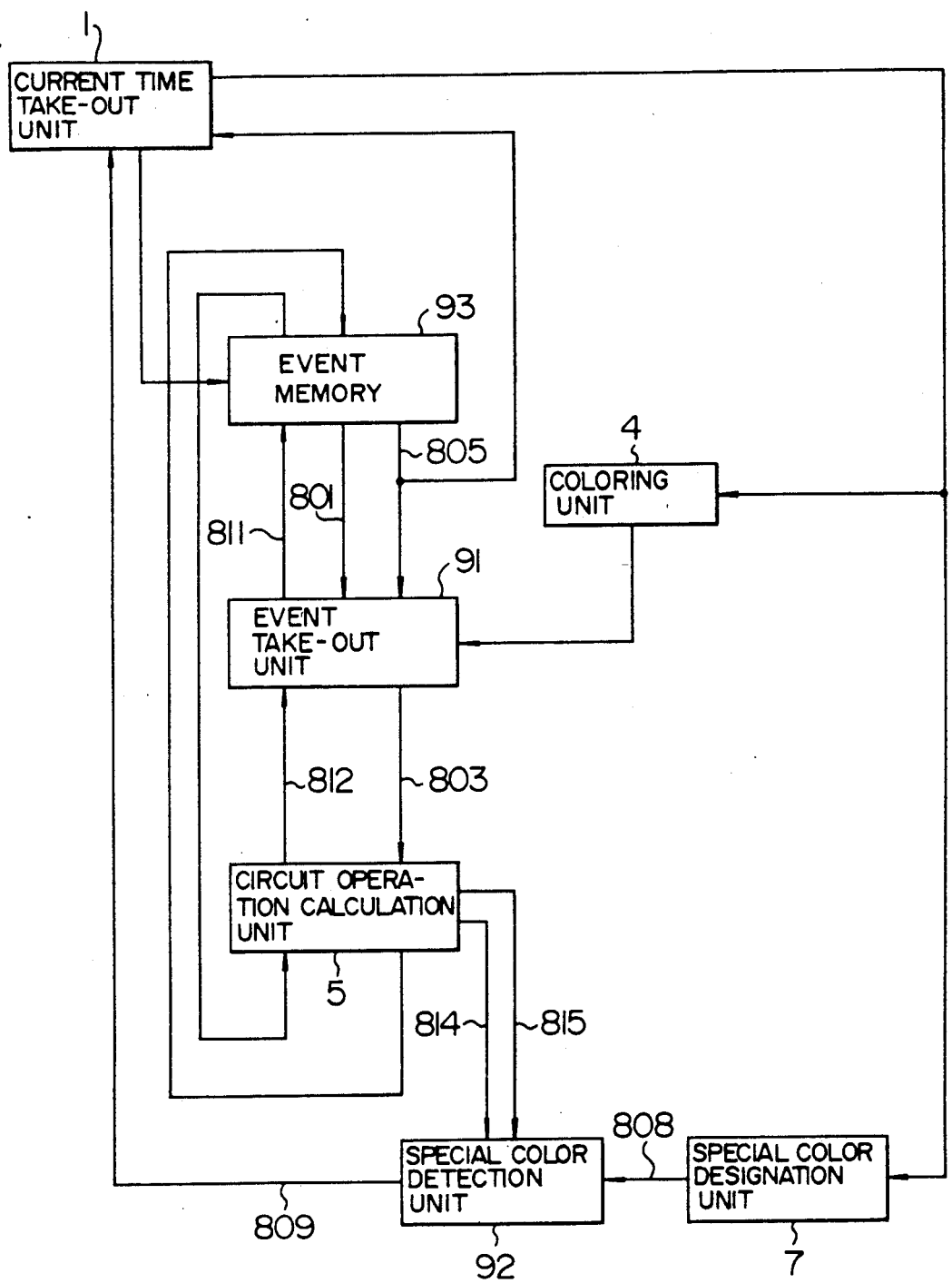
FIG. 9 shows a configuration of a second embodiment of the logic simulation apparatus of the present invention.

FIG. 9 shows a configuration of a second embodiment of the logic simulation apparatus of the present invention. In FIG. 9, numeral 1 denotes a current time output unit, numeral 93 denotes an event memory, numeral 91 denotes an event take-out unit, numeral 4 denotes a coloring unit, numeral 5 denotes a circuit operation calculation unit, numeral 92 denotes a special color detection unit, numeral 7 denotes a special color designation unit, and numerals 801, 803, 805, 808, 809, 811, 812, 814 and 815 denote signal lines.

The logic simulation apparatus of FIG. 9 is different from the logic simulation apparatus of FIG. 1 in that a signal line for informing from the event take-out unit 91 to the special color detection unit 92 the presence or absence of blue and green events in the event take-out unit 91 is omitted, and the operations of the event memory 93, event take-out unit 91 and special color detection unit 92 are different.

The differences are now explained for a case where the event take-out unit 91 takes out the event a of FIG. 18 from the event memory 93.

It is assumed that the current time is T1. The event memory 93 outputs a true value on the signal line 805 when there is an event having the equal event time to the current time in the event memory 93, and outputs a false value on the signal line 805 when there is no such event, as the event memory 2 of FIG. 1 does.

The event take-out unit 91 outputs a read event command on the signal line 811 when the value on the signal line 805 is true, as the event take-out unit 3 of FIG. 1 does.

When the event memory 93 receives the read event command from the signal line 811, it outputs on the signal line 801 an event e which is one of the events having the equal event time to the current time T1. Unlike the event memory 2 of FIG. 1, the event memory 93 holds the event a therein.

When the event take-out unit 91 receives the event a from the signal line 801, it outputs an event b on the signal line 803 as the event take-out unit 3 of FIG. 1 does. Thereafter, the event take-out unit 91 outputs an erase event command on the signal line 811 after it has received from the signal line 812 a signal indicating the receipt of the event b by the circuit operation calculation unit 5.

When the event memory 93 receives the erase event command from the signal line 811, it erases the event a from the event memory 93.

The special color detection unit 92 examines the values on the signal lines 814 and 815 outputted by the circuit operation calculation unit 5 and the value on the signal line 808 outputted by the special color designation unit 7, and outputs a true value on the signal line 809 if there is an event having the special color in the circuit operation calculation means 5 and outputs a false value on the signal line 809 if there is no event having the special color in the circuit operation calculation unit 5.

The processes by the current time output unit 1, coloring unit 4, circuit operation calculation unit 5 and special color designation units 7 are identical to those of the logic simulation apparatus of FIG. 1 and hence the explanation thereof is omitted.

In accordance with the present embodiment, since the event which is present in the event take-out unit is also present in the event memory, it is not necessary to independently check whether the event having the equal event time to the current time is present in the event take-out unit. Accordingly, the signal line indicating the presence or absence of the event having the special color in the event take-out unit and related hardware may be omitted.

Figure 10:
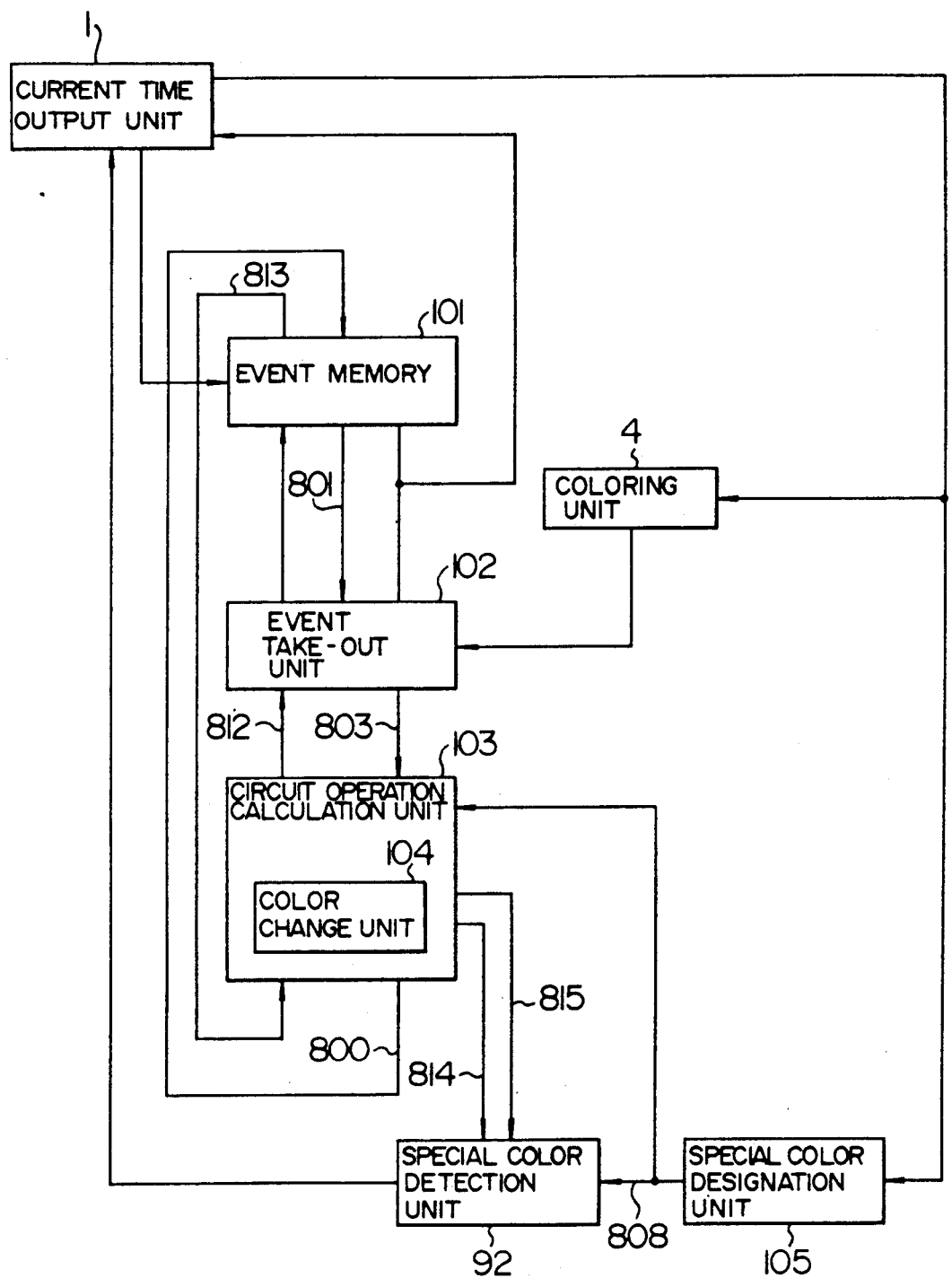
FIG. 10 shows a configuration of a third embodiment of the logic simulation apparatus of the present invention.

FIG. 10 shows a third embodiment of the logic simulation apparatus of the present invention. In FIG. 10, numeral 1 denotes a current time output unit, numeral 101 denotes an event memory, numeral 102 denotes an event take-out unit, numeral 4 denotes a coloring unit, numeral 103 denotes a circuit operation calculation unit, numeral 104 denotes a color change unit, numeral 92 denotes a special color detection unit, numeral 105 denotes a special color designation unit, and numerals 800, 801, 803, 808, 812, 813, 814 and 815 denote signal lines.

FIG. 19 shows a structure of a second example of the data structure of the event. In FIG. 19, f, g, h, i and j denote events, T5, T6 and T7 denote event times, G5 and G7 denote element numbers, and C5, C6 and C7 denote colors.

The processes by the current time output unit 1 and the coloring unit 4 are identical to those by the current time output unit 1 and the coloring unit 4 of FIG. 1, and the process by the special color detection unit 92 is identical to that by the special color detection unit 92 of FIG. 9.

The special color designation unit 105 outputs the special color on the signal line 808 with the initial value being blue. Except for the initial value of the special color, the process by the special color designation unit 105 is identical to that by the special color designation unit 7 of FIG. 1.

The event memory 101 stores not the event representing the change in the signal status at the output terminal of the element but the event representing the changes in the signal status at the input terminals of the element. Except for the difference in the type of event stored, the operation of the event memory 101 is identical to that of the event memory 93 of FIG. 9.

It is assumed that the current time is T5. The event take-out unit 102 takes out an event f which is one of the events that represent the changes in the signal status at the input terminals of the element and which has the event time T5, from the event memory 101 through the signal line 801, and outputs on the signal line 803 an event g colored with the color C5 by the coloring unit 4. The event take-out unit 102 is identical to the event take-out unit 91 of FIG. 9 except that the event taken out of the event memory 101 is not the event representing the changes in the signal status at the output terminal of the element but the event representing the changes in the signal status at the input terminals of the element.

It is assumed that the element number of the event f is G5, the input terminal number of the element is P5 and the signal status is S5.

The circuit operation calculation unit 103 has the color change unit 104 therein for changing the color of the event. When the circuit operation calculation unit 103 receives the event g from the signal line 803, it outputs on the signal line 812 a signal indicating the receipt of the event g.

The circuit operation calculation unit 103 calculates the changes in the signal status at the input terminals and the output terminals of the elements in the logic circuit to be simulated and represented by the event g, which changes are caused by the changes in the signal status of the logic circuit, based on the event driven algorithm, and outputs on the signal line 800 an event j representing the changes in the signal status at the input terminals of the element. The propagation delay time of the element handled by the circuit operation calculation unit 103 may be zero unlike the circuit operation calculation unit 5 of FIG. 1.

The circuit operation calculation unit 103 reads the special color from the signal line 808. The color change unit 104 selects the special color as the color C7 of the event j which is outputted by the circuit operation calculation unit 103 on the signal line 800 if the event time T7 of the event j is equal to the event time T5 of the event g, and selects other color than the special color if the event time T7 of the event j is not equal to the event time T5 of the event g.

The process of receiving the event g and outputting the event j by the circuit operation calculation unit 103 will be described in detail in connection with a second embodiment of the circuit operation calculation unit.

The circuit operation calculation unit 103 may hold a plurality of events therein and process them in parallel.

The circuit operation calculation unit 103 output a true value on the signal line 814 if there is a blue event in the unit 103, outputs a false value on the signal line 814 if there is no blue event, outputs a true value on the signal line 815 if there is a green event, and outputs a false value on the signal line 815 if there is no green event.

The circuit operation calculation unit 103 holds the event j therein until it receives from the signal line 813 a signal indicating that the event memory 101 has stored the event j, and when it receives that signal, it erases the event j from the unit 103.

In accordance with the present embodiment, if the event time of the event which is present in the circuit operation calculation unit is equal to the current time, the special color is selected as the color of the event, and if the event time of the event which is present in the circuit operation calculation unit is not equal to the current time, the other color than the special color is selected as the color of the event. Thus, even if the element having zero propagation delay time is present in the logic circuit to be simulated, the current time output unit 1 can determine whether the event having the equal event time to the current time is present in the circuit operation calculation unit based on the output of the special color detection unit 92. Accordingly, the logic simulation apparatus of the present embodiment can simulate the logic circuit having an element whose propagation delay time is zero, without emptying the event take-out unit and the circuit operation calculation unit in the pipeline which comprises the event memory, event take-out unit and the circuit operation calculation unit. Thus, the reduction of the simulation speed due to the gap in the pipeline can be prevented.

Figure 11:
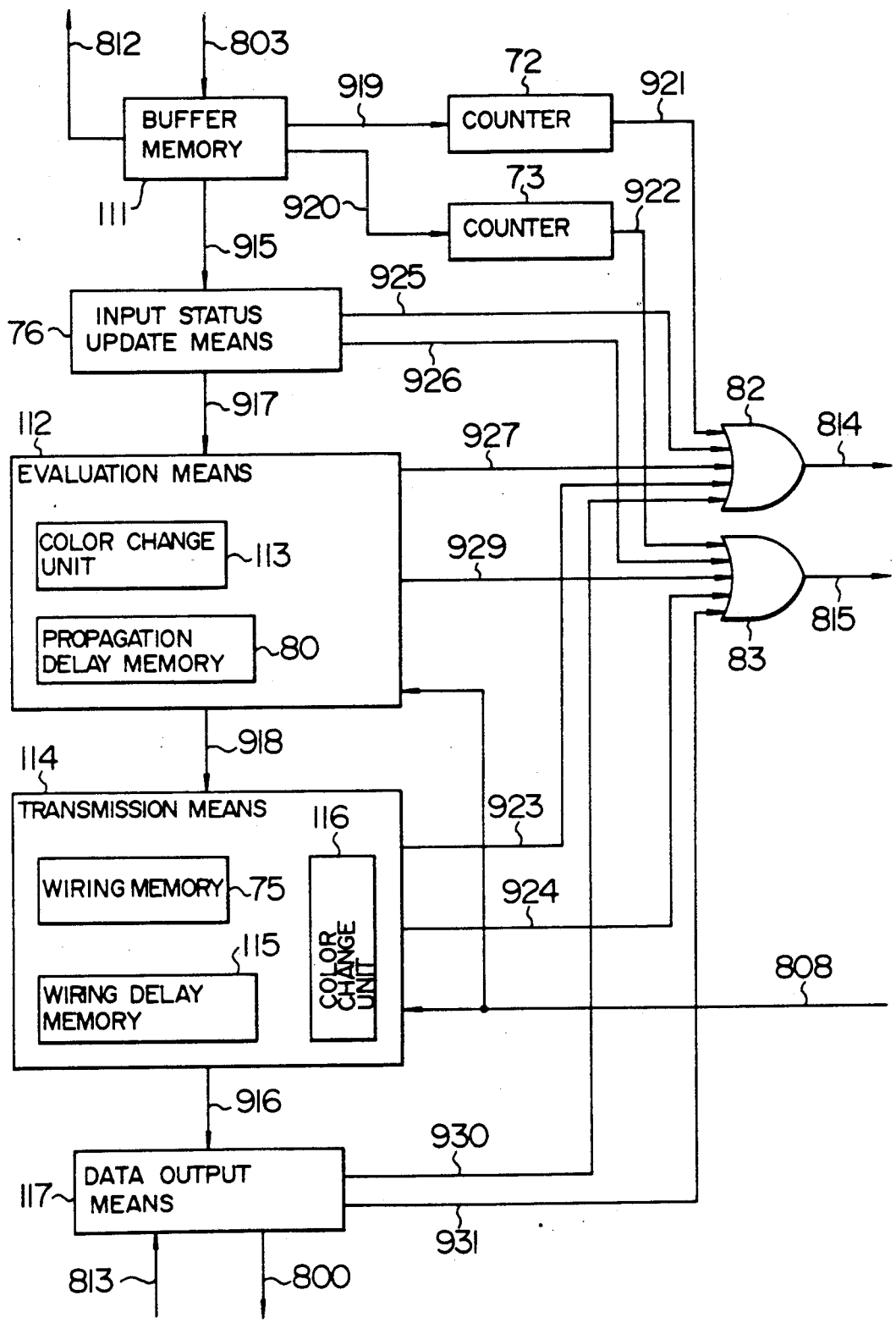
FIG. 11 shows a configuration of a second embodiment of the circuit operation calculation unit.

FIG. 11 shows a configuration of a second embodiment of the circuit operation calculation unit of the present invention. In FIG. 11, numeral 111 denotes a buffer memory, numerals 72 and 73 denote counters, numeral 76 denotes input status update means, numeral 112 denotes evaluation means, numerals 113 and 116 denote color change units, numeral 80 denotes a propagation delay memory, numeral 114 denote transmission means, numeral 75 denotes a wiring memory, numeral 115 denotes a wiring delay memory, numeral 117 denotes data output means, numerals 82 and 83 denote OR gates, and numerals 915, 916, 917, 918, 919, 920, 921, 922, 923, 924, 925, 926, 927, 929, 930, 931, 800, 803, 808, 812, 813, 814 and 815 denote signal lines. In FIG. 11, the input status memory, output status memory, element identification memory and output calculation means shown in FIG. 8 are omitted.

The buffer memory 111 receives the event g of FIG. 19 from the signal line 803 and temporarily stores the event g. Then, the buffer memory 111 outputs on the signal line 812 a signal indicating the receipt of the event g. Before the buffer memory 111 outputs the signal indicating the receipt of the event g on the signal line 812, it sends an add command to the signal line 919 if the color C5 of the event g is blue, and sends the add command to the signal line 920 if the color C5 is green.

The buffer memory 111 can store a plurality of events therein and outputs them on the signal line 915 in the order of receipt. The buffer memory 111 outputs a subtract command on the signal line 919 if the color of the outputted event is blue, and outputs the subtract command on the signal line 920 if the color of the outputted event is green.

The counter 72 counts the number of blue events which are present in the buffer memory 111. The initial value of the count is "0". When the counter 72 receives the add command from the signal line 919, it increments the count by one, and when it receives the subtract command from the signal line 919, it decrements the count by one. The counter 72 outputs a false value on the signal line 921 when the count is "0", and outputs a true value on the signal line 921 when the count is than "0".

The counter 73 counts the number of green events which are present in the buffer memory 111. The initial value of the count is "0". When the counter 73 receives an add command from the signal line 920, it increments the count by one, and when it receives a subtract command from the signal line 920, it decrements the count by one. The counter 73 outputs a false value on the signal line 922 when the count is "0", and outputs a true value on the signal line 922 when the count is other than "0".

When the input status update means 76 receives the event g from the signal line 915, it outputs on the signal line 917 an event h which represents new signal status S51, S52, - - - S5n at all input terminals of the element G5, as the input status update means 76 of FIG. 8 does. Then, the input status update means 76 erases the event g.

The input status update means 76 outputs a true value on the signal line 925 if there is a blue event in the means 76, outputs a false value on the signal line 925 if there is no blue event, outputs a true value on the signal line 926 if there is a green event, and outputs a false value on the signal line 926 if there is no green event.

The evaluation means 112 comprises the propagation delay memory 80 which stores the propagation delay time of the element between the change in the signal at the input terminal of the element and the change in the signal status at the output terminal of the same element, and the color change unit 113 for determining the color of the event outputted by the evaluation means 112.

When the evaluation means 112 receives the event h from the signal line 917, it calculates the event time T6 of the event which represents the change in the signal status at the output terminal of the element G5 and the new signal status S6 at the output terminal of the element G5, as the evaluation means 78 of FIG. 8 does, and if the signal status at the output terminal of the element G5 changes, it prepares an event i which represents the change and outputs it on the signal line 18. The color change unit 113 of the evaluation means 12 reads the special color from the signal line 808 and selects one of blue and green as the color C6 of the event i. The color change unit 113 selects the special color for the color C6 if T5 is equal to T6, that is, if the propagation delay time of the element C5 read from the propagation delay memory 80 is zero, and selects other than the special color if T5 is not equal to T6, that is, if the propagation delay time of the element G5 read from the propagation delay memory 80 is not zero.

The evaluation means 112 outputs the event i on the signal line 918 and then erases the event h.

The evaluation means 112 outputs a true value on the signal line 927 if there is a blue event in the evaluation means 112, outputs a false value on the signal line 927 if there is no blue event, outputs a true value on the signal line 929 if there is a green event, and output a false value on the signal line 929 if there no green event.

The transmission means 114 comprises the wiring memory 75 which stores the wiring of the logic circuit to be simulated, the wiring delay memory 115 which stores times required for the changes in the signal status to propagate through the wiring and the color change unit 116 for determining the color of the event outputted by the transmission means 114.

When the transmission means 114 receives the event i from the signal line 918, it accesses the wiring memory 75 by using the element number G5 of the event i as an address to read the element number G7 of the element succeeding to the element G5 and the input terminal number P7 of the element G7, and prepares an event i which represents the change in the signal status at the input terminal P7 of the succeeding stage element G7 and outputs it on the signal line 916.

The transmission means 114 sets a time T7 which is a sum of the time required for the change in the signal status at the output terminal of the element G5 to be propagated to the input terminal P7 of the succeeding stage element G7, read from the wiring delay memory 115, and the event time T6 of the event i as the event time of the event j, and sets the signal status S6 of the event i as the signal status of the event j.

The color change unit 116 of the transmission means 114 reads the special color from the signal line 08 and selects one of blue and green as the color of the event j.

The color change unit 116 selects the special color for the color C7 of the event j if the color C6 is the special color and T6 is equal to T7, that is, if the color C6 is the special color and the wiring delay time read from the wiring delay memory 115 is zero, and selects other than the special color if the color C6 is not equal to the special color or T6 is not equal to T7, that is, if the color C6 is not equal to the special color or the wiring delay time read from the wiring delay memory 115 is not zero.

After the transmission means 114 has outputted the event j on the signal line 916, it erases the event i.

The transmission means 114 outputs a true value on the signal line 923 if there is a blue event in the transmission means 114, outputs a false value on the signal line 923 if there is no blue event, outputs a true value on the signal line 924 if there is a green event, and outputs a false value on the signal line 924 if there is no green event.

When the data output means 117 receives the event j from the signal line 916, it temporarily stores the event j and outputs it on the signal line 800. The data output means 117 holds the event j until it receives from the signal line 813 a signal indicating that the event memory has stored the event j, and after it has received such a signal, it receives a new event from the signal line 916.

The data output means 117 outputs a true value on the signal line 930 if there is a blue event in the data output means 117, outputs a false value on the signal line 930 if there is no blue event, outputs a true value on the signal line 931 if there is a green event, and outputs a false value on the signal line 931 if there is no green event.

The OR gate 82 always reads the values on the signal lines 921, 923, 925, 927 and 930, and outputs a true value on the signal line 814 if at least one of those values is true and outputs a false value on the signal line 814 if all of those values are false.

The OR gate 83 always reads the values on the signal lines 922, 924, 926, 929 and 931, and outputs a true value on the signal line 815 if at least one of those values is true and outputs a false value on the signal line 815 if all of those values are false.

In the present embodiment, the color change units are provided in both the evaluation means and the transmission means. If the simulation is carried out with zero wiring delay time, the event time of the event outputted by the transmission means is always equal to the event time of the event received by the transmission means and the color of the event outputted by the transmission means is always equal to the color of the event received by the transmission means, and hence the wiring delay memory and the color change unit may be removed from the transmission means.

In such an arrangement, the event received by the circuit operation calculation unit and the event outputted by the circuit operation calculation unit may be the event which represents the change in the signal status at the output terminal of the element, and the transmission means may be arranged between the buffer memory and the input status update means. In this case, the event memory in the logic simulation apparatus of FIG. 10 stores the event which represents the change in the signal status at the output terminal of the element, and the event take-out unit takes out the event which represents the change in the signal status at the output terminal of the element, from the event memory.

If only the wiring delay is handled and the simulation is carried out with zero propagation delay time of the element, the event time of the event outputted by the evaluation means is always equal to the event time of the event received by the evaluation means and the color of the event outputted by the evaluation means is always equal to the color of the event received by the evaluation means. Thus, the propagation delay memory and the color change unit may be removed from the evaluation means.

Figure 12:
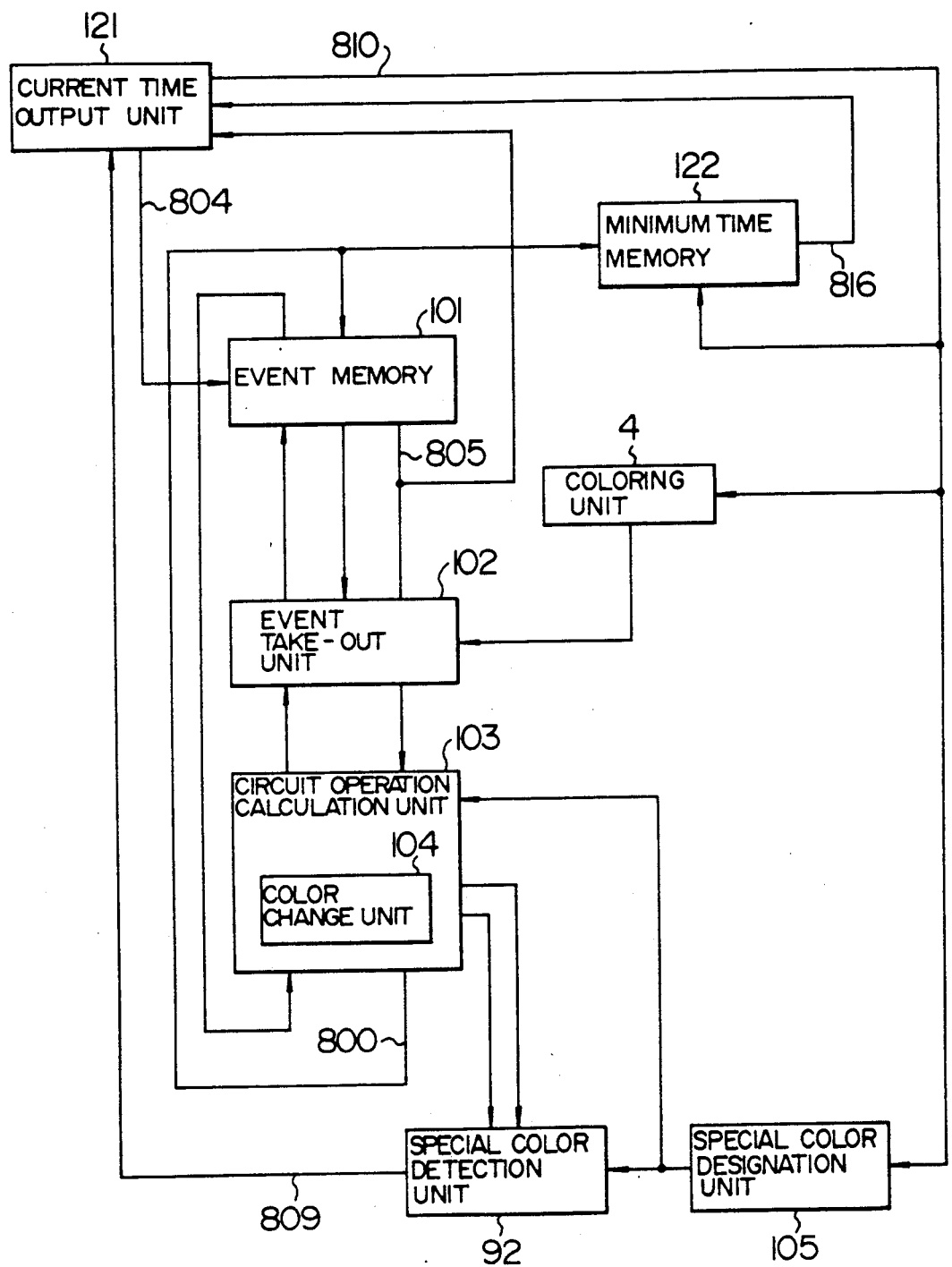
FIG. 12 shows a configuration of a fourth embodiment of the logic simulation apparatus of the present invention.

FIG. 12 shows a configuration of a fourth embodiment of the logic simulation apparatus of the present invention. In FIG. 12, numeral 121 denotes a current time output unit, numeral 101 denotes an event memory, numeral 102 denotes an event take-out unit, numeral 103 denotes a circuit operation calculation unit, numeral 4 denotes a coloring unit, numeral 104 denotes a color change unit, numeral 92 denotes a special color detection unit, numeral 105 denotes a special color designation unit, numeral 122 denotes a minimum time memory, and numerals 800, 804, 805, 809, 810 and 816 denote signal lines.

The minimum time memory 122 stores a minimum value of an event time of the event outputted by the circuit operation calculation unit 103 on the signal line 800, and outputs it on the signal line 816. When the current time output unit 121 outputs a change color command on the signal line 810, the minimum time memory 122 initializes the stored event time to an infinite.

The current time output unit 121 outputs the current time on the signal line 804. The initial value of the current time is "0". The current time output unit 121 reads the value on the signal line 809 and when the value is false, it starts to update the current time. So long as the value on the signal line 805 is false and the current time is smaller than the value on the signal line 816, it continuously advances the current time by one at a time. When the value on the signal line 805 is true or when the current time is equal to the value on the signal line 816, the current time output unit 121 stops to update the current time and outputs a change color command on the signal line 810. If the value on the signal line 805 is already true or the current time is equal to the value on the signal line 816 when the current time output unit 121 starts to update the current time, it does not advance the current time but outputs the change color command on the signal line 810.

The processes by the event memory 101, event take-out unit 102, circuit operation calculation unit 103 including the color change unit 104, coloring unit 4, special colo designation unit 105 and special color detection uni 2 are identical to the processes by the event memory 101, event take-up unit 102, circuit operation calculation unit 103, coloring unit 104, special color designation unit 105 and special color detection unit 92 of FIG. 10, and hence the explanation thereof is omitted.

If the value stored in the minimum time memory is two or more larger than the current time and there is no event in the event memory which has an event time one larger than the current time when the update of the current time is started, the current time may be advanced two or more at a time in the present embodiment of the logic simulation apparatus.

In the present embodiment, the current time output unit starts to update the current time when the value on the signal line 809 becomes false. Alternatively, it may start to update the current time when the values on both the signal lines 809 and 805 are false.

FIG. 13 shows a configuration of an embodiment of the minimum time memory of the present invention. In FIG. 13, numeral 131 denotes memory means, numeral 132 denotes compare means, numeral 133 denotes control means and numerals 935, 937, 800, 810 and 816 denote signal lines.

The memory means 131 stores the event time of the event outputted on the signal line 800 and outputs it on the signal line 816.

Prior to the execution of simulation, the control means 133 outputs an initialize command on the signal line 937. When the control means 133 receives the change color command from the signal line 810 during the execution of simulation, it outputs the initialize command on the signal line 937.

When the memory means 131 receives the initialize command from the signal line 937, it initializes the value which it stores and outputs on the signal line 816 to an infinite.

During the execution of simulation, the compare means 132 compares the event time of the event with the value on the signal line 816 when the event is outputted by the circuit operation calculation unit or the signal line 800, and if the value on the signal line 816 is larger, it outputs a true value on the signal line 935. If the value on the signal line 816 is smaller than the event time of the event on the signal line 800 or they are equal, the compare means 132 outputs a false value on the signal line 935.

When the value on the signal line 935 is true, the control means 133 outputs a write data command on the signal line 937, and when the value on the signal line 935 is false, it does not output the write data command on the signal line 937.

When the memory means 131 receives the write data command from the signal line 937, it stores the event time of the event on the signal line 800 and outputs it on the signal line 816.

FIG. 14 shows a configuration of a second embodiment of the current time output unit of the present invention. In FIG. 14, numeral 11 denotes a counter, numeral 141 denotes control means, and numerals 900, 804, 805, 809, 810 and 816 denote signal lines.

The counter 11 always outputs the current time on the signal line 804.

Prior to the start of simulation, the control means 141 outputs an initialize current time command on the signal line 900. When the counter 11 receives the initialize current time command from the signal line 900, it sets the current time to "0".

During the execution of simulation, the control means 141 reads the value on the signal line 809, and when the value on the signal line 809 is false, it starts to update the current time and carries out the following process. The control means 141 reads the values on the signal lines 804 and 816 and compares them. So long as the value on the signal line 804 is smaller than the value on the signal line 816 and the value on the signal line 805 is false, the control means 141 continuously outputs an update current time command on the signal line 900.

When the counter 11 receives the update current time command from the signal line 900, it advances the current time by one.

When the value on the signal line 805 is true or when the value on the signal line 804 and the value on the signal line 816 are equal, the control means 141 stops to output the update current time command on the signal line 900 and outputs a change color command on the signal line 810.

If the value on the signal line 805 is already true or the value on the signal line 804 is equal to the value on the signal line 816, the control means 141 does not output the update current time command on the signal line 900 but outputs the change color command on the signal line 810.

Figure 15:
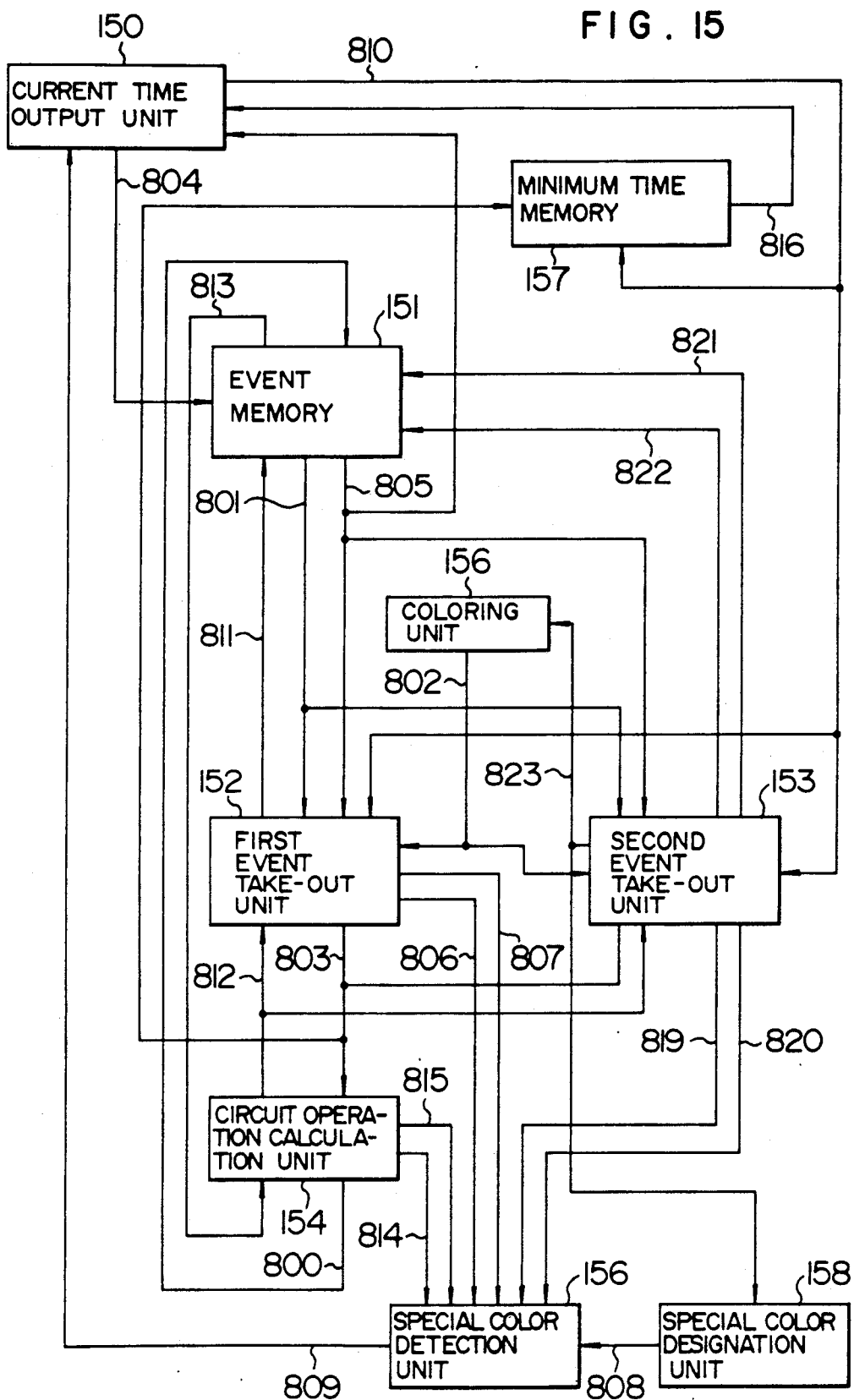
FIG. 15 shows a configuration of a fifth embodiment of the logic simulation apparatus of the present invention.

FIG. 15 shows a configuration of a fifth embodiment of the logic simulation apparatus of the present invention. In FIG. 15, numeral 150 denotes a current time output unit, numeral 151 denotes an event memory, numeral 152 denotes a first event take-out unit, numeral 153 denotes a second event take-out unit, numeral 154 denotes a circuit operation calculation unit, numeral 155 denotes a special color detection unit, numeral 156 denotes a coloring unit, numeral 157 denotes a minimum time memory unit, numeral 158 denotes a special color designation unit, and numerals 800, 801, 802, 803, 804, 805, 806, 807, 808, 809, 810, 811, 812, 813, 814, 815, 816, 819, 820, 821, 822 and 823 denote signal lines.

In the following description, a process for taking out an event having the equal event time to the current time from the event memory 151 is called a first event take-out process, and a process for taking out an event having a minimum event time among the events which represent changes in signal status at all input terminals of elements, where the elements of the event representing changes in signal status at input terminals thereof are independently handled, from the event memory 151 independently from the current time, is called a second event take-out process.

The current time output unit 150 outputs the current time on the signal line 804 with an initial value of "0". When the value on the signal line 809 is false, the current time output unit 150 starts to update the current time, and so long as the value on the signal line 805 is false and the current time is smaller than the value on the signal line 816, it advances the current time. When it completes the update of the current time, the current time output unit 150 outputs an end of update of current time signal on the signal line 810. If the value on the signal line 805 is already true or the value on the signal line 816 is equal to the current time when the update of the current time is started, the current time output unit 150 does not advance the current time but outputs the end of update of current time signal on the signal line 810.

The event memory 151 has a construction which fits to both the first event take-out process and the second event take-out process, and stores events which represent changes in signal status at the input terminals of the elements. As to the take-out process of the first event and the storing of the event received from the signal line 800, the event memory 151 carries out the same process as that of the event memory 2 of FIG. 1 except that it stores the event which represents the change in signal status at the input terminals of the elements. An embodiment of the event memory 151 is explained later as a second embodiment of the event memory.

When the first event take-out unit 152 receives the end of update of the current time signal from the signal line 810, it starts the first event take-out process, and when the value on the signal line 805 becomes false, it stops the first event take-out process. The content of the first event take-out process is identical to that of the event take-out unit 3 of FIG. 1 except that the event received from the event memory 151 is the event which represents the change in signal status at the input terminals of the element.

When the value on the signal line 805 becomes false, the second event take-out unit 153 outputs a change color command on the signal line 823. Then, it starts the second event take-out process, and when it receives the end of update of current time signal from the signal line 810, it stops the second event take-out process. The second event take-out unit 153 carries out the second event take-out process by using the signal lines 822, 821 and 801, and outputs on the signal line 803 the event which corresponds to the event taken out of the event memory 151, colored by the coloring unit 156. The event time of the event taken out of the event memory 151 by the second event take-out process may be equal to the current time or it may be different from the current time. The detail of the second event take-out process will be described later in connection with an embodiment of the second event take-out unit and a second embodiment of the event memory.

The second event take-out unit 153 outputs a true value on the signal line 819 when there is a blue event in the unit 153, and produces a false signal on the signal line 819 when there is no blue event. The second event take-out unit 153 further outputs a true value on the signal line 820 when there is a green event in the unit 153, and outputs a false value on the signal line 820 when there is no green signal.

The coloring unit 156 selectively outputs blue and green on the signal line 802 with the blue being an initial value as the coloring unit 4 of FIG. 1 does, and applies the colors through the signal line 802 to the events which the first event take-out unit 152 and the second event take-out unit 153 take out of the event memory 151. The process by the coloring unit 156 is identical to that of the coloring unit 4 of FIG. 1 except that the colors are applied to the events which are taken out of the event memory 151 by either the first event take-out unit 152 or the second event take-out unit 153, and the change color command is received from not the signal line 810 but the signal line 823.

The circuit operation calculation unit 154 receives from the signal line 803 the event outputted by the first event take-out unit 152 or the second event take-out unit 153, calculates the changes in signal status at the input terminals and output terminals of the elements in the logic circuit, which changes are caused by the change in signal status of the logic circuit to be simulated and represented by the event, by using the event driven algorithm, and outputs the event representing the changes in signal status at the input terminals of the element, on the signal line 800. The circuit operation calculation unit 154 does not have a color change unit and always sets the output event color to the color of the event which is received from the signal line 803 and which is the cause of the output event. The process by the circuit operation calculation unit 154 is same as that of the circuit operation calculation unit 103 of FIG. 10 except for the manner of decision of the output event color to the signal line 800.

The process by the special color designation unit 158 is same as that of the special color designation unit 7 in the logic simulation apparatus of FIG. 1 except that it receives the change color command not from the signal line 810 but from the signal line 823.

The minimum time memory 157 stores a minimum value of the event times of the events outputted on the signal line 803 by the first event take-out unit 152 and the second event take-out unit 153, and outputs the stored value on the signal line 816. When the minimum time memory 157 receives the end of update of current time signal from the signal line 810, it initializes the value which it stores and outputs on the signal line 16 to an infinite.

The special color detection unit 155 outputs a true value on the signal line 809 when the event having the special color is present in at least one of the first event take-out unit 152, second event take-out unit 153 and circuit operation calculation unit 154, and outputs a false value on the signal line 809 when the event having the special color is not present in any of the first event take-out unit 152, second event take-out unit and circuit operation calculation unit 154, based on the values on the signal lines 806 and 807 outputted by the first event take-out unit 152, the values on the signal lines 819 and 820 outputted by the second event take-out unit 153, the values on the signal lines 814 and 815 outputted by the circuit operation calculation unit 154 and the special color on the signal line 808 outputted by the special color designation unit 158.

In accordance with the present embodiment, even if the first event take-out unit cannot take out the event from the event memory, the second event take-out unit may take out the event from the event memory and send it to the circuit operation calculation unit. Accordingly, the simulation may be carried out without generating a gap in the pipeline comprising the event memory, first event take-out unit, the second event take-out unit and the circuit operation calculation unit.

In the present embodiment, one event memory and one circuit operation calculation unit are provided, although any of those units may be provided in parallel for parallel processing. Where the first event take-out unit and the second event take-out unit are paired and arranged in parallel, the same number of coloring units and minimum time memories may be arranged in parallel to relate them to the first event take-out unit and the second event take-out unit in one-to-one correspondence so that the events outputted by the first event take-out unit and the second event take-out unit are colored by the corresponding coloring units, the event times of those events are stored in the corresponding minimum time memory, the respective coloring units change the output event colors by the change color commands from the corresponding second event take-out units, the special color designation unit changes the special color when all of the second event take-out unit output the change color commands, and the current time output unit updates the current time within a range lower than the minimum value of the values stored in all of the minimum time memories.

In this manner, the event memory 151, first event take-out unit, second event take-out unit and circuit operation calculation unit may be readily paralleled to make the operation speed of the logic simulation apparatus faster.

Alternatively, only one current time output unit may be provided and the logic simulation apparatus of FIG. 15 excluding the current time output unit may be used as a basic unit and a plurality of such basic units are arranged in parallel and coupled by communication lines, and the current time output unit starts to update the current time when all of the coloring units output false values to update the current time within a range lower than a minimum value of the values stored in all of the minimum time memories. By this arrangement, the operation speed of the logic simulation is increased by parallel processing.

Figure 16:
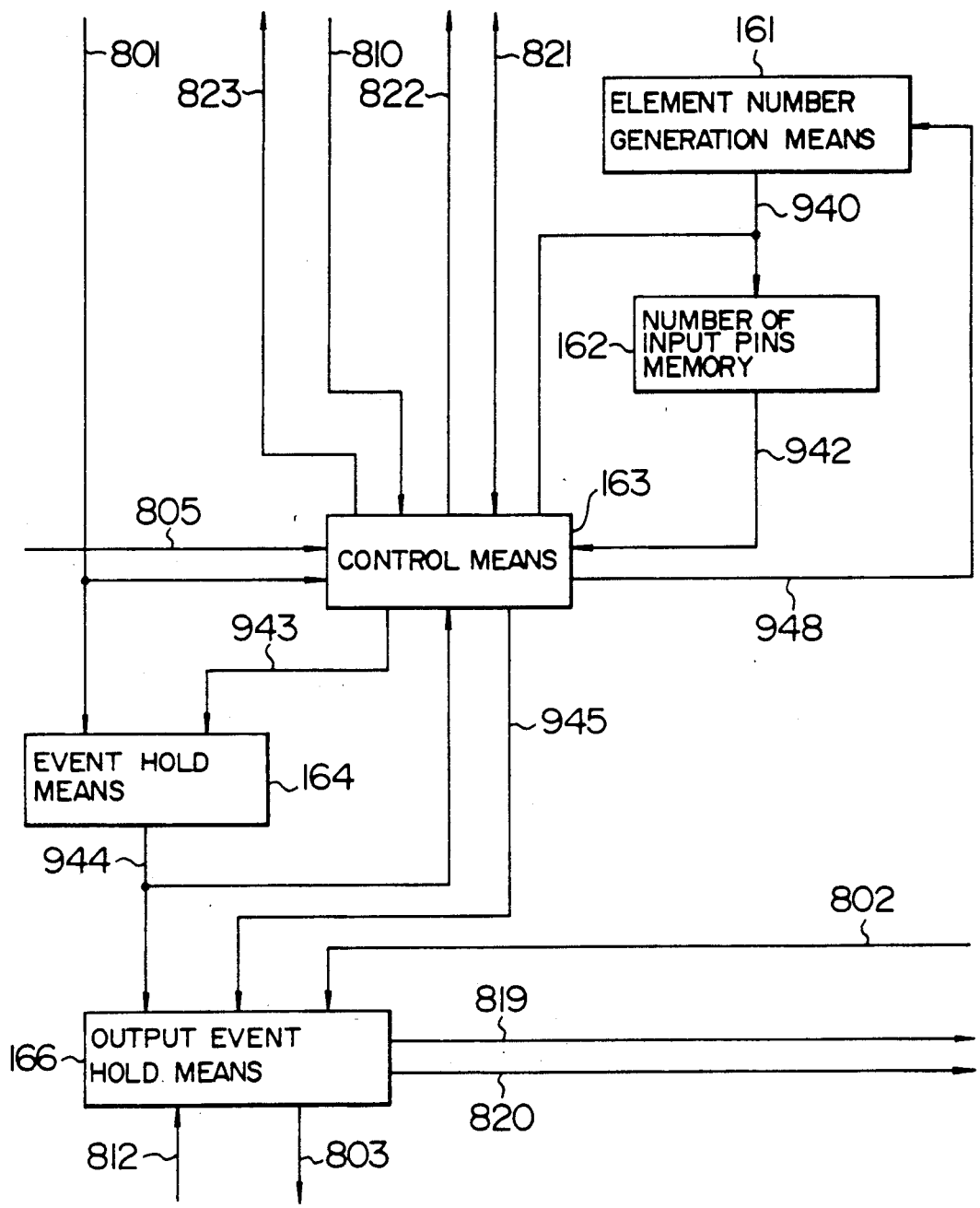
FIG. 16 shows a configuration of an embodiment of a second event take-out unit.

FIG. 16 shows a configuration of an embodiment of the second event take-out unit of the present invention. In FIG. 16, numeral 161 denotes element number generation means, numeral 162 denotes a number of input pins memory, numeral 163 denote control means, numeral 164 denotes event hold means, numeral 166 denotes output event hold means, and numerals 940, 942, 943, 944, 945, 948, 801, 802, 803, 805, 810, 819, 820, 821, 822, 812 and 823 denote signal lines.

The control means 163 controls the operation of the overall second event take-out unit. When the value on the signal line 805 is false, it outputs a change color command on the signal line 823. Then, it starts the second event take-out process which is to be described later. When it receives an end of update of current time signal, it stops the second event take-out process.

The processes done by the means of the second event take-out unit during the second event take-out process are explained.

The control means 163 outputs generate element number command on the signal line 948.

When the element number generation means 161 receives the generate element number command from the signal line 948, it generates an element number and outputs it on the signal line 940.

The number of input pins memory 162 stores the number of input pins of each element. It outputs the number of input pins of the element designated by the value on the signal line 940, on the signal line 942.

The control means 163 reads the element number on the signal line 940, sets the input pin number to "1" and outputs the set of the input pin number and the element number on the signal line 940, on the signal line 821. The control means 163 also outputs a read event command on the signal line 822.

As will be described in connection with a second embodiment of the event memory, when the event memory receives the read event command from the signal line 822, it outputs on the signal line 801 the element number on the signal line 821, the element number which is equal to the input pin number, and the event which has first stored in the event memory among the events stored in the event memory having the input pin number. The event memory does not erase the event which it outputted on the signal line 801 from the event memory until it receives an erase event command from the signal line 822..

When the event memory outputs the event on the signal line 801, the control means 163 controls the event hold means 164 through the signal line 943 to cause the event hold means 164 to store the event on the signal line 801.

The event hold means 164 outputs the event which it received from the signal line 801 and stores therein, on the signal line 944.

Then, the control means 163 reads the number of input pins of the element from the signal line 942, sequentially increments the input pin number starting from 2 within a range lower than the value on the signal line 942, and outputs the set of the input pin number and the element number read from the signal line 940 on the signal line 921 and outputs the read event command on the signal line 822.

When the event is outputted from the event memory on the signal line 801, the control means 163 compares the event time of the event on the signal line 801 with the event time of the event on the signal line 944. If the event time of the event on the signal line 801 is smaller, it causes the event hold means 164 to store the event on the signal line 801. When the event time of the event on the signal line 801 is larger or the event times of both events are equal, it does not cause the event hold means 164 to store the event on the signal line 801.

The control means 163 continues to read the event and store it in the event hold means 164 until the reading of the event and the update of the event to be stored in the event hold means 164 are completed for the input pin number equal to the value read from the signal line 942 or a value NULL which indicates that there is no corresponding event in the event memory is outputted on the signal line 801.

When the reading of the event and the update of the event to be stored in the event holding means 164 are completed, the control means 164 controls the output event hold means 166 through the signal line 945 to cause the output event hold means 166 to store the event on the signal line 944, outputs the element number and the input pin number of the event on the signal line 944, on the signal time 821, and outputs an erase event command on the signal line 822. Then, the control means 163 sends a generate element number command to the signal line 948, reads a new element number from the signal line 940 and starts to read the event from the event memory for the element designated by the element number.

When NULL is sent to the signal line 801 before the completion of the reading of the event and the update of the event to be stored in the event hold means 164 for the value of the input pin number read from the signal line 942, the control means 163 does not cause the output event hold means 166 to store the event on the signal line 944 and does not output the erase event command on the signal line 822 but sends the generate element number command to the signal line 948 and starts the process to a new element.

The output event hold means 166 outputs a true value on the signal line 819 and a false value on the signal line 820 when the event stored therein is blue, and outputs a false value on the signal line 819 and a true value on the signal line 820 when the event stored therein is green. When the output event hold means 166 receives from the signal line 812 the signal indicating that the circuit operation calculation unit has received the event, it erases the event which it stores and outputs on the signal line 803.

Figure 17:
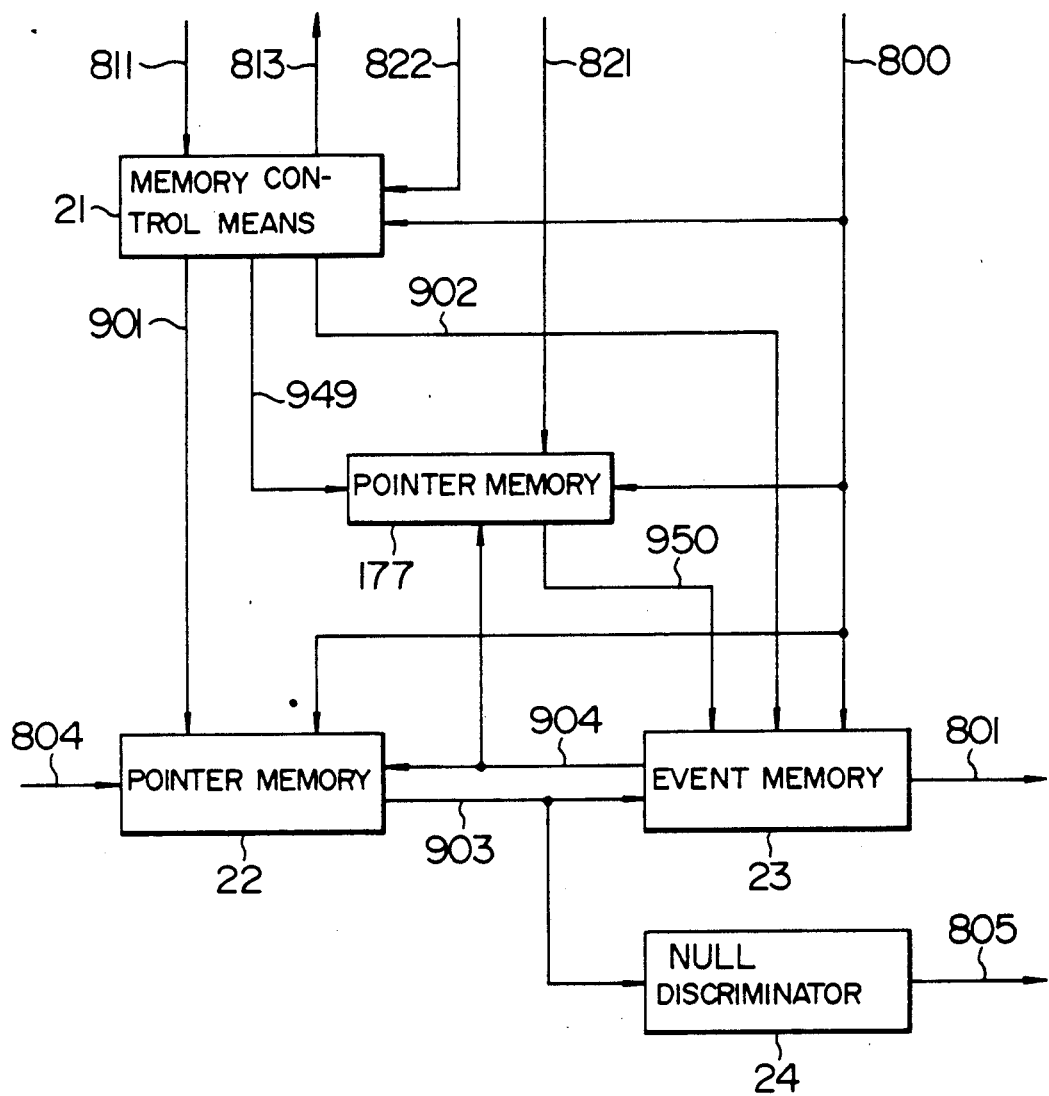
FIG. 17 shows a configuration of a second embodiment of the event memory.
Figure 20:
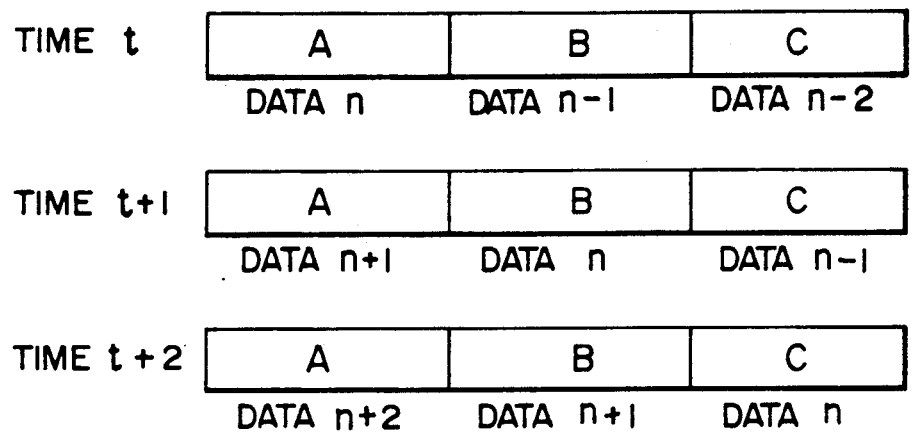
FIGS. 20 and 21 illustrate pipeline processing.
Figure 21:
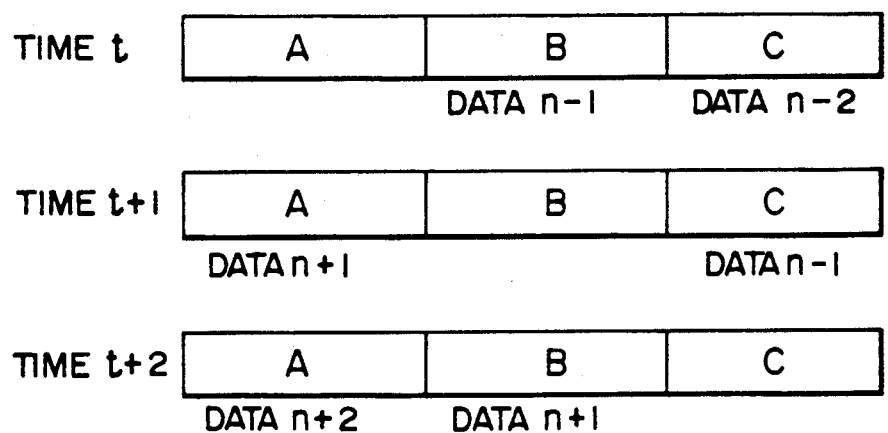
Figure 22:
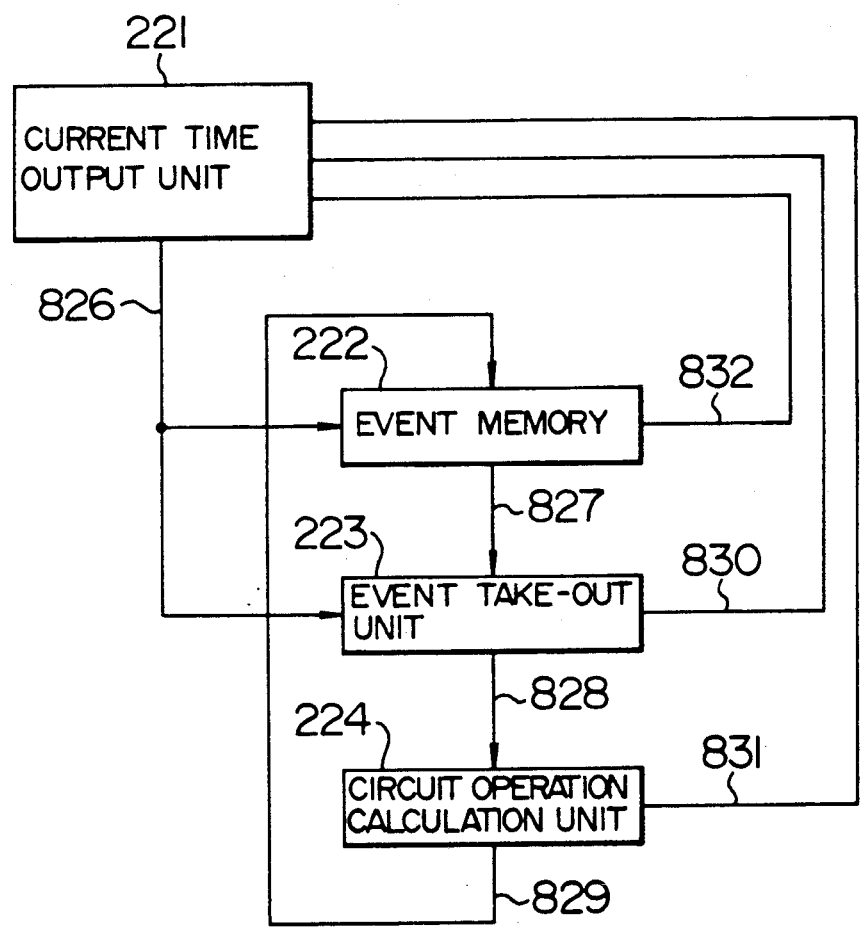
FIG. 22 shows a configuration of a prior art logic simulation apparatus.

FIG. 17 shows a configuration of a second embodiment of the event memory of the present invention. In FIG. 2, numeral 21 denotes memory control means, numerals 22 and 177 denote pointer memories, numeral 23 denotes an event memory, numeral 24 denotes NULL discrimination means, and numerals 901, 902, 903, 904, 49, 950, 800, 801, 804, 805, 811, 813, 821 and 822 denote signal lines.

The event memory 23 stores the event received from the signal line 800, excluding the color.

The pointer memory 22 stores an address of the event memory 23 at which an event having the equal event time to the current time is stored.

The pointer memory 22 reads the current time from the signal line 804 and outputs on the signal line 03 an address of the event memory 23 at which one of the events having the equal event time to the current time, by using the current time as a key. When there is no event having the equal event time to the current time in the event memory 23, the pointer memory 22 outputs NULL on the signal line 903.

The NULL discrimination means 24 outputs a false value on the signal line 805 when the value on the signal line 903 is NULL, and a true value when the value the signal line 903 is not NULL.

When the memory control means 21 receives the read event command from the signal line 811, it controls the event memory 23 through the signal line 902 to cause the event memory 23 to output the event stored at the address designated by the value on the signal line 903, on the signal line 901, output on the signal line 904 the address on the signal line 903 as it is, and erase the event stored at that address. The memory control means 21 further controls the pointer memory 22 through the signal line 901 to inform to the pointer memory 22 that the event has been erased from the address of the event memory 23 designated by the value on the signal line 904, and causes the pointer memory 22 to output on the signal line 903 the address at which one of the events having the equal event time to the current time is stored, which events remain in the event memory 23 even after the above event has been erased. If there is no event in the event memory 23 which has the equal event time to the event memory 23 as a result of the erasure of above event, the pointer memory 22 is caused to output NULL on the signal line 903. The control means 163 further controls the pointer memory 177 through the signal line 949 to inform to the pointer memory 177 that the event stored at the address on the signal line 904 has been erased from the event memory 23.

The pointer memory 177 has the element number and the input pin number as keys and stores addresses of the event memory 23 at which the events having the equal element number and input pin number are stored.

When the memory control means 21 receives the read event command from the signal line 822, it controls the pointer memory 177 through the signal line 949 to cause the pointer memory 177 to output on the signal line 950 the address of the event memory 23 at which the event first received by the event memory 23 is stored, among the events having the equal element number and input pin number to the element number and input pin number on the signal line 821. When there is no event in the event memory 23 which has the element number and the input pin number on the signal line 821, the pointer memory 177 outputs NULL on the signal line 950. The memory control means 21 further controls the event memory 23 through the signal line 902 to cause the event memory 23 to output on the signal line 801 the event stored at the address designated by the value on the signal line 950. When the value on the signal line 950 is NULL, the event memory 23 outputs NULL on the signal line 801.

When the memory control means 21 receives the erase event command from the signal line 822, it controls the pointer memory 177 through the signal line 949 to cause the pointer memory 177 to output on the signal line 950 the address which has been outputted on the signal line 950 when it received the read event command from the signal line 822 for the equal element number and input pin number, among the addresses of the event memory 23 at which events having the equal element number and input pin number to the element number and input pin number on the signal line 821 are stored, and informs that the event stored at that address has been erased from the event memory 23.

The event control means 21 further controls the event memory 23 through the signal line 902 to cause the event memory 23 to erase the event stored at the address on the signal line 950 and output the value on the signal line 950, on the signal line 904. The control means 163 further informs to the pointer memory 22 that the event stored at the address on the signal line 904 has been erased from the event memory 23.

When the event is sent to the signal line 800, the memory control means 21 controls the event memory 23 through the signal line 902 to cause the event memory 23 to store the event sent to the signal line 800, excluding the color, and output the stored address on the signal line 904.

The memory control means 21 further controls the pointer memory 22 through the signal line 901 to cause the pointer memory 22 to store that the event sent to the signal line 800 has been stored at the address of the event memory 23 designated by the value on the signal line 904. The memory control means 21 further controls the pointer memory 177 to cause the pointer memory 177 to store that the event sent to the signal line 800 has been stored at the address of the event memory 23 designated by the value on the signal line 904.

After the storing of the event in the event memory 23 and the storing of the addresses to the pointer memory 22 and the pointer memory 177, the memory control means 21 outputs a signal indicating the end of storing of the event.

In accordance with the present embodiment, the event memory can be constructed to fit to either the first event take-out process and the second event take-out process.

I claim:

1. A logic simulation method of a parallel processing type for calculating an operation of a logic circuit to be simulated by using an algorithm of an event driven type, wherein a value calculated as a current simulation time, denominated as current time, is used, and a change of a signal state occurring at an input terminal and an output terminal of an element included in said logic circuit is represented by data denominated as events, said events including a value, denominated as an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, and wherein each of the events has an identifier for classifying the events into a plurality of groups, said logic simulation method comprising the steps of:

(a) storing data representing changes of the states of signals applied to the input terminal of said logic circuit as unprocessed event groups;

(b) taking out, from the stored unprocessed event groups, an event having an event time equal to the current time and erasing the event which has been stored;

(c) setting a value to an identifier of the taken-out event;

(d) processing the event, to whose identifier a value has been set, by using the algorithm of the event driven type and storing, as a new unprocessed event, a newly calculated event by the processing using the algorithm of the event driven type;

(e) deciding whether or not an event having an event time equal to the current time is present in the stored unprocessed event groups;

(f) selecting one of values which can be assumed by the identifiers for classifying the events into a plurality of groups;

(g) deciding whether or not an event, to whose identifier a value equal to the selected value has been set, is present in the other stored unprocessed event groups; and (h) updating the current time when it is decided that an event having the event time equal to the current time is not present in the stored unprocessed event groups, and when it is decided that an event, to whose identifier a value equal to the selected value has been set, is not present in the other stored unprocessed event groups;

said steps (a)-(h) being processible in parallel with one another.

2. A logic simulation method of a parallel processing type for calculating an operation of a logic circuit to be simulated by using an algorithm of an event driven type, wherein a value calculated as a current simulation time, denominated as current time, is used, and a change of a signal state occurring at an input terminal and an output terminal of an element including in said logic circuit is represented by data denominated as events, said events including a value, denominated as an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, and wherein each of the events has an identifier for classifying the events into a plurality of groups, said logic simulation method comprising the steps of:
(a) storing data representing changes of the states of signals applied to the input terminal of said logic circuit as unprocessed event groups;
(b) taking out, from the stored unprocessed event groups, an event having an event time equal to the current time and erasing the event which has been stored;
(c) setting a value to an identifier of the taken-out event;
(d) processing the event, to whose identifier a value has been set, by using the algorithm of the event driven type, and setting a value equal to the value set to the identifier of the taken-out event to an identifier of a newly calculated event obtained by the processing using the algorithm of the event driven type, when an event time of the newly calculated event is equal to the event time of the taken-out event which has been taken out from the stored unprocessed event groups and which has been used to calculate the newly calculated event, while, setting a value different from the value set to the identifier of the taken-out event to an identifier of a newly calculated event, when an event time of the newly calculated event is different from the event time of the taken-out event;
(e) storing the newly calculated event as a new unprocessed event;
(f) deciding whether or not an event having an event time equal to the current time is present in the stored unprocessed event groups;
(g) deciding whether or not an event whose identifier has a set value equal to the value set to the identifier of a taken-out event, which has been taken out from the stored unprocessed event groups, is present in the other stored unprocessed event groups;
(h) updating the current time when it is decided that an event having the event time equal to the current time is not present in the stored unprocessed event groups, and when it is decided that an event whose identifier has a set value equal to the value set to the identifier of the taken-out event, which has been taken out from the stored unprocessed event groups, is not present in the other stored unprocessed event groups;
(i) changing a value to be set to the identifier of the taken-out event, which has been taken out from the stored unprocessed event groups, when the current time has been updated;
said steps (a)–(i) being processible in parallel with one another.

3. A logic simulation method of a parallel processing type for calculating an operation of a logic circuit to be simulated by using an algorithm of an event driven type, wherein a value calculated as a current simulation time, denominated as current time, is used, and a change of a signal state occurring at an input terminal and an output terminal of an element included in said logic circuit is represented by data denominated as events, said events including a value, denominated as an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect the element which is represented by the processible event and the signal state of whose input terminal has changed, and only when the signal state of the output terminal has changed in an event representing the change of the signal state of the output terminal generated anew, and wherein each of the events has an identifier for classifying the events into a plurality of groups, said logic simulation method comprising the steps of:
(a) storing data representing changes of the states of signals applied to the input terminal of said logic circuit as unprocessed event groups;
(b) taking out, from the stored unprocessed event groups, an event having an event time equal to the current time and erasing the event which has been stored;
(c) setting a value to an identifier of the taken-out event;
(d) processing the event, to whose identifier a value has been set, by using the algorithm of the event driven type, and setting a value equal to the value set to the identifier of the taken-out event to an identifier or a newly calculated event obtained by the processing using the algorithm of the event driven type, when an event time of the newly calculated event is equal to the event time of the taken-out even which has been taken out from the stored unprocessed event groups and which has been used to calculate the newly calculated event, while, setting a value different from the value set to the identifier of the taken-out event to an identifier of a newly calculated event, when an event time of the newly calculated event is different from the event time of the taken-out event;
(e) storing the newly calculated event as a new unprocessed event;
(f) storing a minimum value of event times of newly calculated event groups;
(g) deciding whether or not an event having an event time equal to the current time is present in the stored unprocessed event groups;
(h) deciding whether or not an event whose identifier has a set value equal to the value set to the identifier of a taken-out event, which has been taken out from the stored unprocessed event groups, is present in the other stored unprocessed event groups;

(i) updating the current time successively within a range in which an event having an even time equal to the current time is not present in the stored unprocessed event groups and the current time does not exceed a value stored as a minimum value of the event times of the events which have been newly calculated by using the algorithm of the event driven type, when it is decided that an event having the event time equal to the current time is not present in the stored unprocessed event groups and when it is decided that an event whose identifier has a set value equal to the value set to the identifier of the taken-out event, which has been taken out from the stored unprocessed event groups, is not present in the other stored unprocessed event groups;

(j) changing a value to be set to the identifier of the taken-out event, which has been taken out from the stored unprocessed event groups, when the updating of the current time has been completed; and (k) re-initializing a value stored as a minimum value of the event times of the event groups which have been calculated by using the algorithm of the event driven type;

said steps (a)-(k) being processible in parallel with one another.

4. A logic simulation method of a parallel processing type for calculating an operation of a logic circuit to be simulated by using an algorithm of an event driven type, wherein a value calculated as a current simulation time, denominated as current time, is used, and a change of a signal state occurring at an input terminal and an output terminal of an element included in said logic circuit is represented by data denominated as events, said events including a value, denominated as an event time, representing a time when the change of the signal state has occurred, a value representing to what state the signal state has changed, and a value representing the input terminal or the output terminal of the element where the signal state has changed, and in which algorithm, an event having an event time equal to said current time is decided to be processible, the signal state of the output terminal of the element is calculated anew only with respect to the element which is representing by the processible event and the signal state of whose input terminal has changed, and only when the signal state of the output terminal has changed is an event representing the change of the signal state of the output terminal generated anew, and wherein each of the events has an identifier for classifying the events into a plurality of groups, said logic simulation method comprising the steps of:

(a) storing data representing changes of the states of signals applied to the input terminal of said logic circuit as unprocessed event groups;

(b) performing first take-out processing by taking out, from the stored unprocessed event groups, an event having an event time equal to the current time and erasing the event which has been stored;

(c) performing second take-out processing when the first take-out processing is not performed, wherein an unprocessed event representing the change of the signal state of the input terminal of each element is processed independently of any other elements, and, when unprocessed events representing the changes of the signal states of the input terminals are present at all input terminals of the elements, then an event having a minimum event time among the unprocessed events is taken out and the event which has been stored is erased;

(d) storing a minimum one of the event times of the events taken out in the first take-out processing or the second take-out processing;

(e) setting a value to an identifier of the taken-out event which is taken-out in the first take-out processing or the second take-out processing;

(f) processing the event, to whose identifier a value has been set, by using the algorithm of the event driven type, and setting a value equal to the set value of the identifier of an event, which has been taken-out from the stored unprocessed event groups so as to be used to process the event, to the identifier of a newly calculated event obtained by the processing using the algorithm of the event driven type;

(g) storing the newly calculated event, to whose identifier the value has been set, as a new unprocessed event;

(h) deciding whether or not an event having an event time equal to the current time is present in the stored unprocessed event groups;

(i) selecting one of values which can be assumed by the identifiers for classifying the events into a plurality of groups;

(j) deciding whether or not an event, to whose identifier a value equal to the above-selected value has been set, is present in the other stored unprocessed event groups;

(k) updating the current time successively within a range in which an event having an event time equal to the current time is not present in the stored unprocessed event groups and the current time does not exceed a value stored as a minimum value of the event times of the events which have been taken out by the first take-out processing or the second take-out processing, when it is decided that an event having the event time equal to the current time is not present in the stored unprocessed event groups and that an event whose identifier has a set value equal to the above-selected value is not present in the other stored unprocessed event groups;

(l) changing, at the time of starting the second take-out processing, a value to be set to the identifier of an event which has been taken out from the stored unprocessed event groups, (m) changing, at the time of starting the second take-out processing, a value to be selected as one of the values, which values can be assumed by an identifier for classifying the events into a plurality of groups, to a value which has been set to an event taken out from the stored unprocessed event groups, until immediately before the time of starting the second take-out processing; and (n) re-initializing, at the time of completion of updating the event time, the value stored as ⸱ minimum value of the event times of the events taken out by the first take-out processing or the second take-out processing;

said steps (a)–(n) being processible in parallel with one another.

5. A logic simulation apparatus of a parallel processing type for calculating an operation of a logic circuit to be simulated by using an algorithm of an event driven type, wherein a value calculated as a current simulation time, denominated as current time, us used, and a change of a signal state occurring at an input terminal and an output terminal of an element included in said logic circuit is represented by data denominated as events, said events including a value, denominated as an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, said logic simulation apparatus comprising:

(a) a current time outputting unit for outputting a current time;

(b) an event memory unit for storing unprocessed events;

(c) an event take-out unit for taking out from said event memory unit an event having an event time equal to the current time and erasing from said event memory unit the taken-out event;

(d) a coloring unit for assigning one of a plurality of identifiers, which classify the events into a plurality of groups, to a taken-out event which has been taken out from said event memory unit;

(e) a circuit operation calculation unit for inputting an event, to which one of said identifiers has been assigned, as input data, calculating a change of a signal state of the logic circuit to be simulated by using the algorithm of the event driven type, and outputting an event representing a result of the calculation as a new unprocessed event having the one of the identifiers;

(f) a special color designation unit for selecting one value from among a plurality of values, which can be assumed by the identifiers assigned to the events by said coloring unit, and outputting t he selected one value as a special color; and (g) a special color presence deciding unit for deciding whether or not an event having an identifier, whose value is equal to the value of the special color, is present in said event take-out unit and said circuit operation calculation unit, wherein, said event memory unit comprises:

storage means for storing the event outputted from said circuit operation calculation unit, but with the identifier being removed therefrom; and means for deciding whether or not an event having an event time equal to the current time is present in said event memory unit, and said current time outputting unit comprises means for updating the current time when said event memory unit has decided that an event having an event time equal to the current time is not present in said event memory unit and simultaneously when said special color presence deciding unit has decided that an event, whose identifier has a set value equal to the special color, is not present in both said event take-out unit and said circuit operation calculation unit;

said units (a)–(g) comprising hardware independent of one another and being operable in parallel with one another.

6. A logic simulation apparatus of a parallel processing type for calculating an operation of a logic circuit to be simulated by using an algorithm of an event driven type wherein a value calculated as a current simulation time, denominated as current time, is used, and a change of a signal state occurring at an input terminal and an output terminal of an element included in said logic circuit is represented by data denominated as events, said events including a value, denominated an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, said logic simulation apparatus comprising:

(a) a current time outputting unit for outputting a current time;

(b) an event memory unit for storing unprocessed events;

(c) an event take-out unit for taking out from said event memory unit an event having an event time equal to the current time and for erasing from said event memory unit the taken-out event;

(d) a coloring unit for assigning one of a plurality of identifiers, which classify the events into a plurality of groups, to a taken-out event which has been taken out from said event memory unit;

(e) a circuit operation calculation unit for inputting an event, to which one of the identifiers has been assigned, as input data, calculating a change of a signal state of the logic circuit to be simulate by using the algorithm of the event driven type, and outputting an event representing a result of the calculation;

(f) a special color designation unit for outputting, as a special color, a value which is the same as the value of an identifier which has been assigned to an event by said coloring unit; and (g) a special color presence deciding unit for deciding whether or not an event having an identifier, whose value is equal to the value of the special color, is present in said event take-out unit and said circuit operation calculation unit, wherein, said circuit operation calculation unit comprises:

means for processing the event, which has been taken out from said event memory unit and to which the identifier has been assigned, by using the algorithm of the event driven type, thereby calculating and outputting a new event;

means for setting a value which is the same as the special color to an identifier of the new event when an event time of the new event is equal to the event time of the taken-out event which has been taken out from said event memory unit and used in the calculation to obtain the new event, while, said means setting a value different from the special color to the identifier of the new event when the event time of the new event is different from the event time of the taken-out event which has been taken out from said event memory unit and used in the calculation to obtain the new event; and means for outputting, as a new unprocessed event, the new event which has been calculated anew and to whose identifier the new value has been assigned, said event memory unit comprises:

storage means for storing the event outputting from said circuit operation calculation unit, but with the identifier being removed therefrom; and means for deciding whether or not an event having an event time equal to the current time is present in said event memory unit, said current time outputting unit comprises means for updating the current time when said event memory unit has decided that an event having an event time equal to the current time is not present in said event memory unit and simultaneously when said special color presence deciding unit has decided that an event, whose identifier has a set value equal to the special color, is not present in both said event take-out unit and said circuit operation calculation unit, and said coloring unit comprises means for changing a value of an identifier to be assigned to a taken-out event which has been taken out from said event memory unit when the current time has been updated, said units (a)–(g) comprising hardware independent of one another and being operable in parallel with one another.

7. A logic simulation apparatus of a parallel processing type for calculating an operation of a logic circuit to be simulated by using an algorithm of an event driven type, wherein a value calculated as a current simulation time, denominated as current time, is used, and a change of a signal state occurring at a input terminal and an output terminal of an element included in said logic circuit is represented by data denominated as events, said events including a value, denominated an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, said logic simulation apparatus comprising:

(a) a current time outputting unit for outputting a current time;

(b) an event memory unit for storing unprocessed events;

(c) an event take-out unit for taking out from said event memory unit an event having an event time equal to the current time and for erasing from said event memory unit the taken-out event;

(d) a coloring unit for assigning one of a plurality of identifiers, which classify the events into a plurality of groups, to a taken-out event which has been taken out from said event memory unit;

(e) a circuit operation calculating unit for inputting an event, to which one of the identifiers has been assigned, as input data, calculating a change of a signal state of the logic circuit to be simulated by using the algorithm of the event driven type, and outputting an event representing a result of the calculation;

(f) a minimum event time memory unit for storing a minimum value of event times of the events outputted from said circuit operation calculating unit;

(g) a special color designation unit for outputting, as a special color, a value which is the same as the value of an identifier which has been assigned to an event by said coloring unit; and (h) a special color presence deciding unit for deciding whether or not an event having an identifier, whose value is equal to the value of the special color, is present in said event take-out unit and said circuit operation calculation unit, wherein said circuit operation calculation unit comprises:

means for processing the event, which has been taken out from said event memory unit and to which the identifier has been assigned, by using the algorithm of the event driven type, thereby calculating and outputting a new event;

means for setting a value which is the same as the special color to an identifier of the new event when an event time of the new event is equal to the event time of the taken-out event which has been taken out from said event memory unit and used in the calculation to obtain the new event, while, said means setting a value different from the special color to the identifier of the new event when the event time of the new event is different from the event time of the taken-out event which has been taken out from said event memory unit and used in the calculation to obtain the new event; and means for outputting, as a new unprocessed event, the new event which has been calculated anew and to whose identifier the new value has been set, said event memory unit comprises:

storage means for storing the event outputted from said circuit operation calculation unit, but with the identifier being removed therefrom; and means for deciding whether or not an event having an event time equal to the current time is present in said event memory unit, said current time outputting unit comprises means for updating the current time successively within a range in which an event having an event time equal to the current time is not present in said event memory unit and the current time does not exceed values stored in said minimum event time memory unit, when it is decided by said event memory unit that an event having the event time equal to the current time is not present in said event memory unit and when it is decided by said special color presence deciding unit that an event, whose identifier has a set value equal to the special color, is not present in both said event take-out unit and said circuit operation calculation unit, said coloring unit comprises means for changing a value of an identifier to be assigned to a taken-out event which has been taken out from said event memory unit when the updating of the current time has been completed, and said minimum time memory unit comprises means for reinitializing the stored minimum value of event times of the events when the updating of the current time has been completed, said units (a)-(h) comprising hardware independent of one another and being operable in parallel with one another.

8. A logic simulation apparatus of a parallel processing type for calculating an operation of a logic circuit to be simulated by using an algorithm of an event driven type, wherein a value calculated as a current simulation time, denominated as current time, is used, and a change of a signal state occurring at an input terminal and an output terminal of an element included in said logic circuit is represented by data denominated as events, said events including a value, denominated an event time, representing a time when the change of the signal state has occurred, a value representing to what state the signal state has changed, and a value representing the input terminal or the output terminal of the element where the signal state has changed, and in which algorithm, an event having an event time equal to the current time is decided to be processible, the signal state of the output terminal of the element is calculated anew only with respect to the element which is represented by the processible event and the signal state of whose input terminal has changed, and only when the signal state of the output terminal has changed is an event representing the change of the signal state of the output terminal generated anew, said logic simulation apparatus comprising:

(a) a current time outputting unit for outputting a current time;

(b) an event memory unit for storing unprocessed events;

(c) a first event take-out unit for taking out form said event memory unit an event having an event tim equal to the current time and erasing from said event memory unit the taken-out event;

(d) a second event take-out unit wherein, when said first take-out unit does not take out an event from said event memory unit, unprocessed events representing the change of the signal state of input terminals of the elements respectively are processed independently of one another among the elements, and when the unprocessed events representing the change of the signal state of the input terminals are present at all the input terminals of the elements, said second event take-out unit takes out an event having a minimum event time among the unprocessed events and erases the events which have been stored;

(e) a minimum event time memory unit for storing a minimum value of events times of the events which have been taken out from said event memory unit by said first event take-out unit or said second event take-out unit;

(f) a coloring unit for assigning one of a plurality of identifiers, which classify the events into a plurality of groups, to a taken-out event which has been taken out from said event memory unit by said first event take-out unit or said second event take-out unit;

(g) a circuit operation calculation unit for inputting an event, to which one of the identifiers has been assigned, as input data, calculating a change of a signal state of the logic circuit to be simulated by using the algorithm of the event driven type, setting, to an identifier of an event representing a result of the calculation, a value which is the same as the set value of the identifier or an event used as input data to calculate the event representing the result of the calculation, and outputting, as a new unprocessed event, the resultant event representing the result of the calculation;

(h) a special color designation unit for selecting one value from among plural values, which can be assumed by the identifiers assigned to the events by said coloring unit, and outputting the selected one value as a special color;

(i) a special color presence deciding unit for deciding whether or not an event having an identifier, whose value is equal to the value of the special color, is present said first and second event take-out units and said circuit operation calculation unit;

wherein, said event memory unit comprises:

storage means for storing the event outputted from said circuit operation calculating unit, but with the identifier being removed therefrom; and means for deciding whether or not an event having an event time equal to the current time is present in said event memory unit, said current time outputting unit comprises means for updating the current time successively within a range in which an event having an event time equal to the current time is not present in said event memory unit and the current time does not exceed values stored in said minimum event time memory unit, when it is decided by said event memory unit that an event having the event time equal to the current time is not present in said event memory unit, and when it is decided by said special color presence deciding unit that an event, whose identifier has a set value equal to the special color, is not present in said first and second event take-out units and said circuit operation calculation unit, said coloring unit comprises means for changing a value of an identifier to be assigned to a taken-out event, which has been taken out from said event memory unit, at the time when said second event take-out unit starts to take out an event from said event memory unit, said special color designating unit comprises means for changing a value, which is outputted as one of plural values assumable by an identifier to be assigned to an event by said coloring unit, at the time when said second event take-out unit starts to take out an event from said event memory unit, to a value, which has been set to an event taken out from a said event memory unit by said coloring unit until immediately before the time when said second event take-out unit starts to take out an event from said event memory unit, and said minimum time memory unit comprises means for reinitializing the stored minimum value of event times of the events when the updating of the current time has been completed, said unit comprising hardware independent of one another and being operable in parallel with one another.

* * * * *